United States Patent
Van Buskirk

(10) Patent No.: US 9,330,755 B1
(45) Date of Patent: May 3, 2016

(54) LATCH CIRCUITS AND METHODS WITH PROGRAMMABLE IMPEDANCE ELEMENTS

(71) Applicant: Adesto Technologies Corporation, Sunnyvale, CA (US)

(72) Inventor: Michael A. Van Buskirk, Saratoga, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 28 days.

(21) Appl. No.: 14/176,123

(22) Filed: Feb. 9, 2014

Related U.S. Application Data

(60) Provisional application No. 61/762,705, filed on Feb. 8, 2013.

(51) Int. Cl.
*G11C 11/00* (2006.01)
*G11C 13/00* (2006.01)

(52) U.S. Cl.
CPC .......... *G11C 13/004* (2013.01); *G11C 13/0069* (2013.01)

(58) Field of Classification Search
CPC .......... G11C 13/0069; G11C 13/0004; G11C 13/0007
USPC ............................ 365/148, 226, 227, 149, 63
See application file for complete search history.

(56) References Cited

U.S. PATENT DOCUMENTS

| | | | |
|---|---|---|---|
| 5,761,115 A | 6/1998 | Kozicki et al. | |
| 6,635,914 B2 | 10/2003 | Kozicki et al. | |
| 7,599,210 B2 | 10/2009 | Okazaki et al. | |
| 8,331,128 B1 | 12/2012 | Derhacobian et al. | |
| 8,611,169 B2 * | 12/2013 | Houle et al. | 365/226 |
| 8,913,444 B1 * | 12/2014 | Gilbert et al. | 365/189.14 |
| 8,947,913 B1 * | 2/2015 | Derhacobian et al. | 365/158 |
| 8,995,173 B1 * | 3/2015 | Derhacobian | 365/149 |

* cited by examiner

*Primary Examiner* — Connie Yoha

(57) ABSTRACT

A circuit can include at least one two terminal element programmable between at least two impedance states; a write section configured to place the element into different impedance states in a write mode; and a read section configured to generate an output value corresponding to the impedance state of at least one element in a read mode; wherein the at least one element draws substantially no current in a standard mode that is different from the write and read modes.

17 Claims, 15 Drawing Sheets

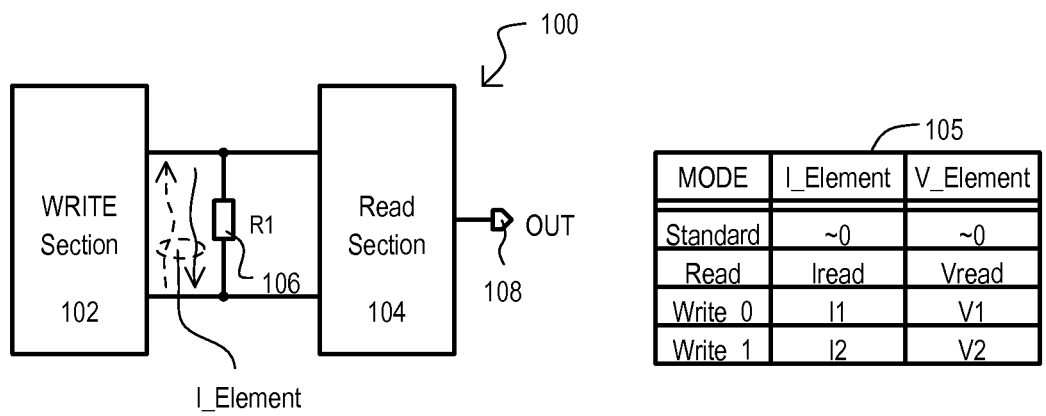
FIG. 1
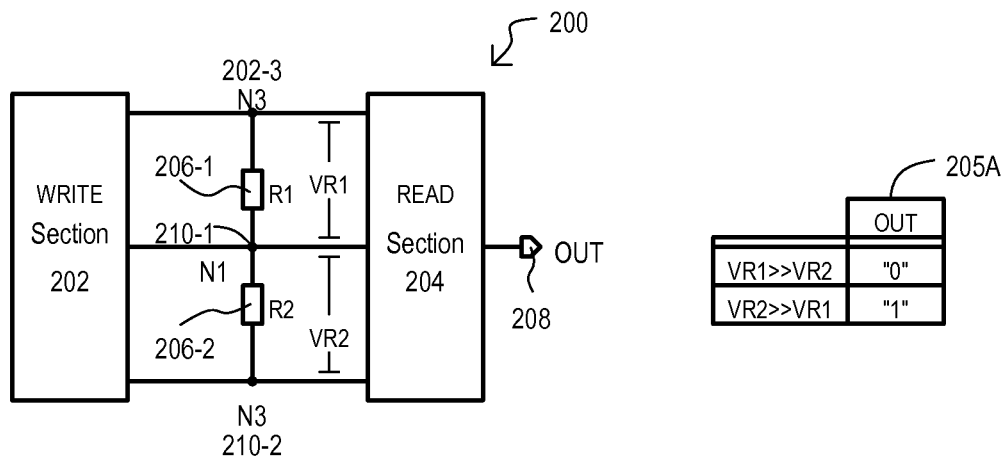
FIG. 2A    (READ)
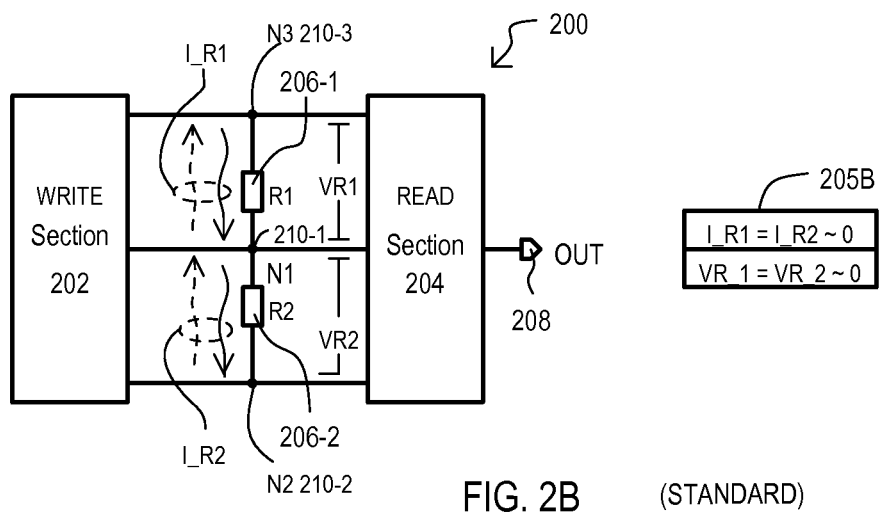
FIG. 2B    (STANDARD)

(WRITE 0, Step 1)

(WRITE 0, Step 2)

(WRITE 1, Step 1)

(WRITE 1, Step 2)

(Load - Reading Element)

(Clear - Program Element)

(SET - Erase Element)

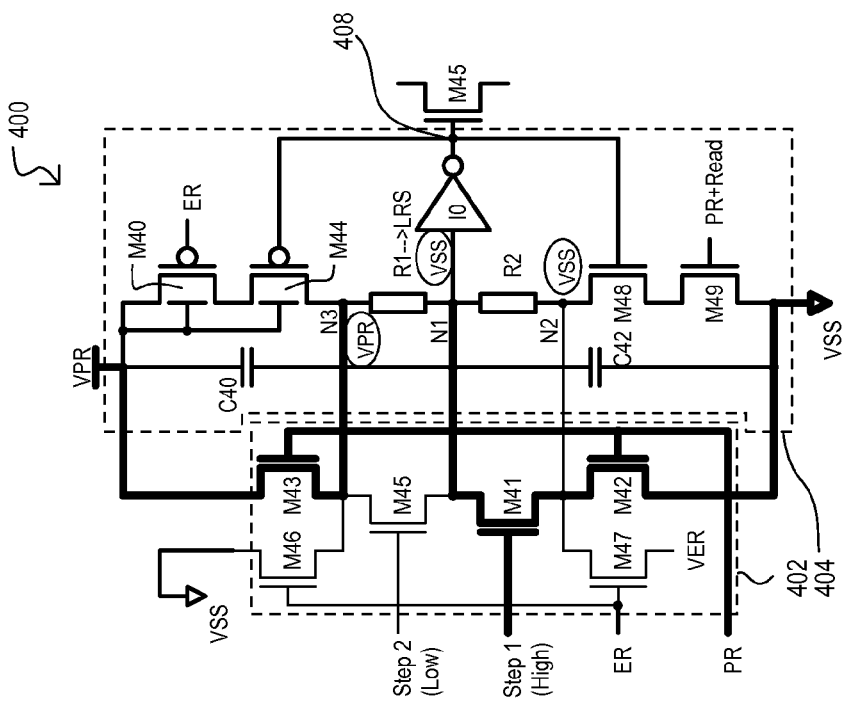
FIG. 4E
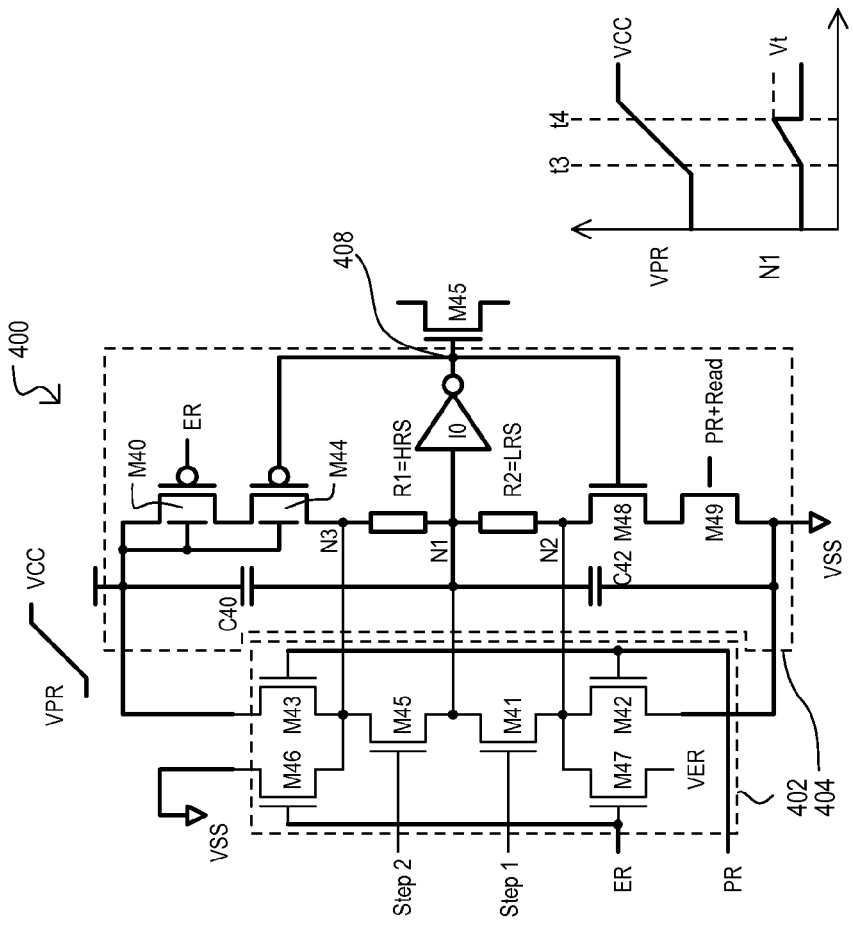
FIG. 4F-1
FIG. 4D

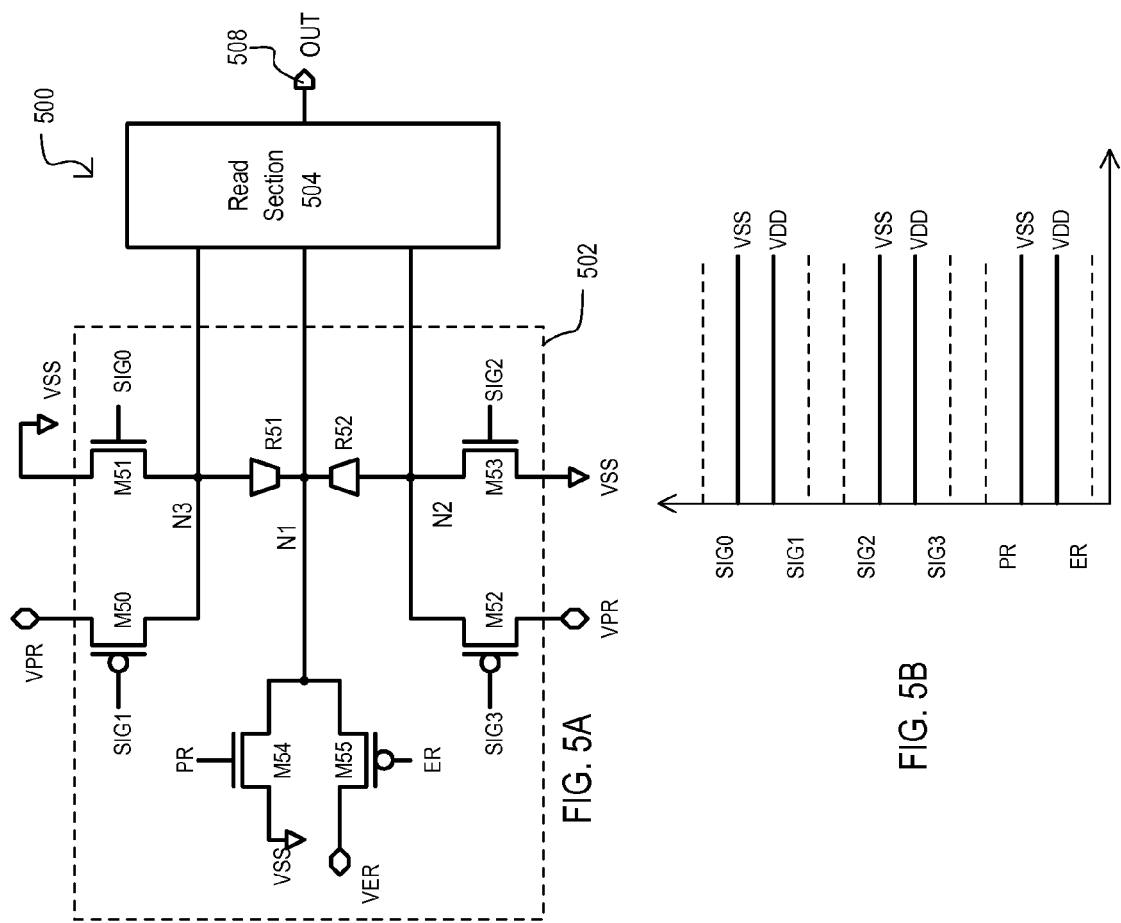
FIG. 5A
FIG. 5B
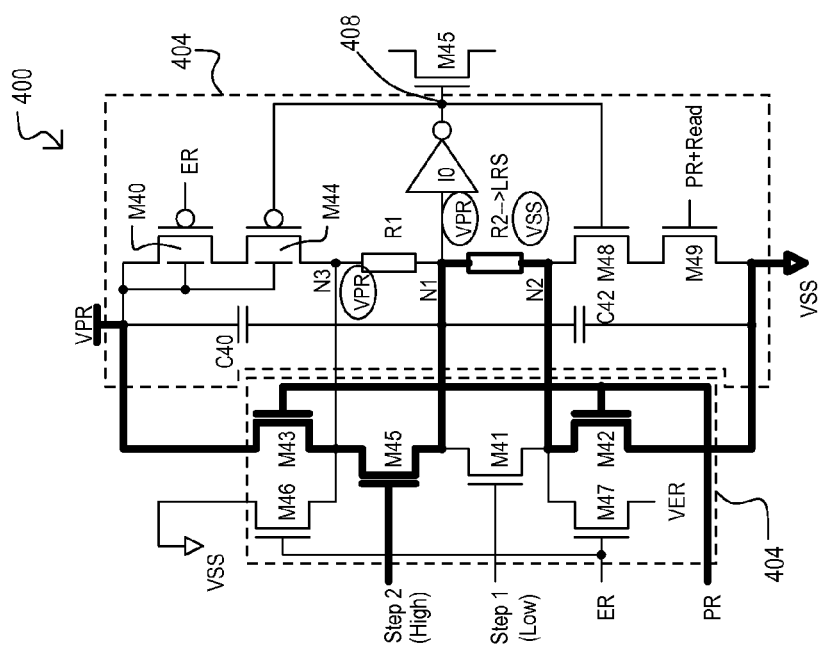
FIG. 4F-4

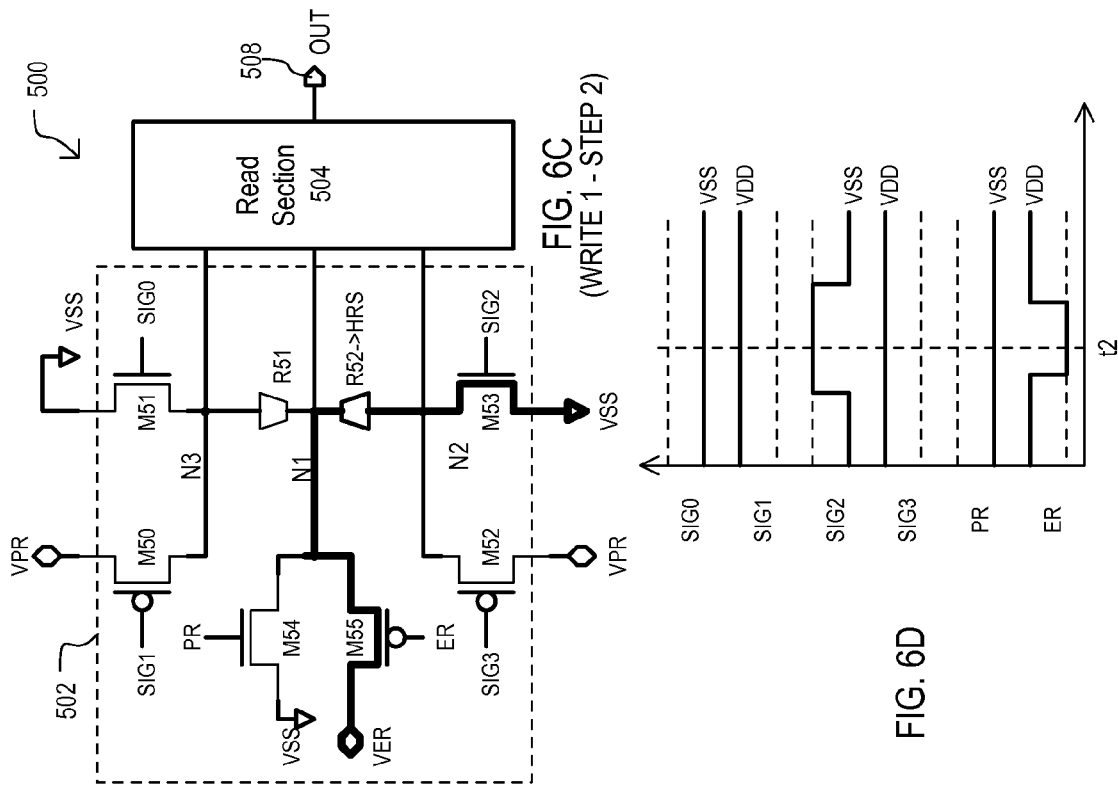
FIG. 6C (WRITE 1 - STEP 2)
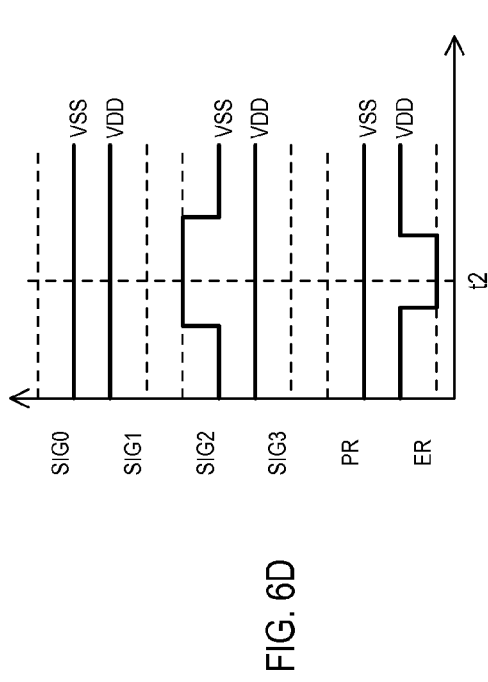
FIG. 6D
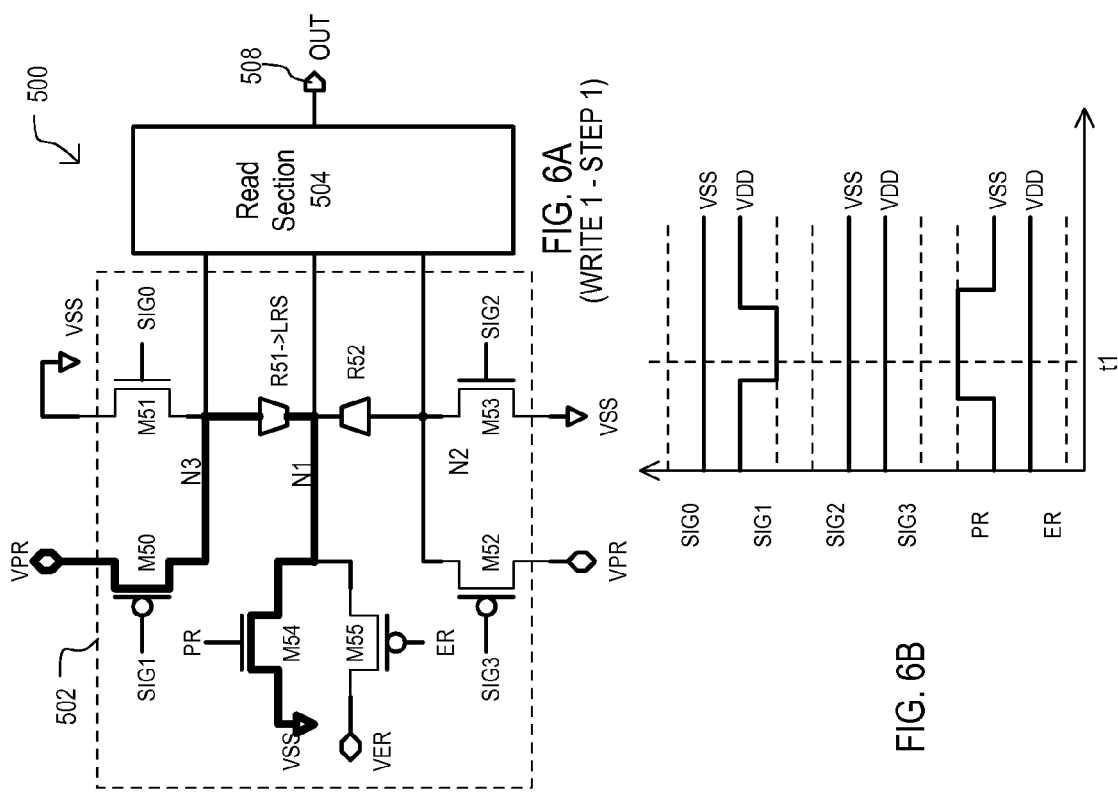
FIG. 6A (WRITE 1 - STEP 1)
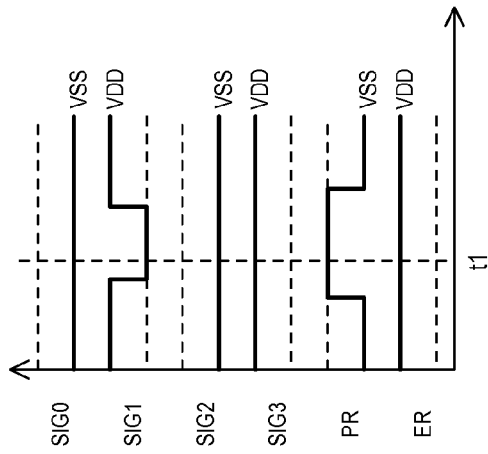
FIG. 6B

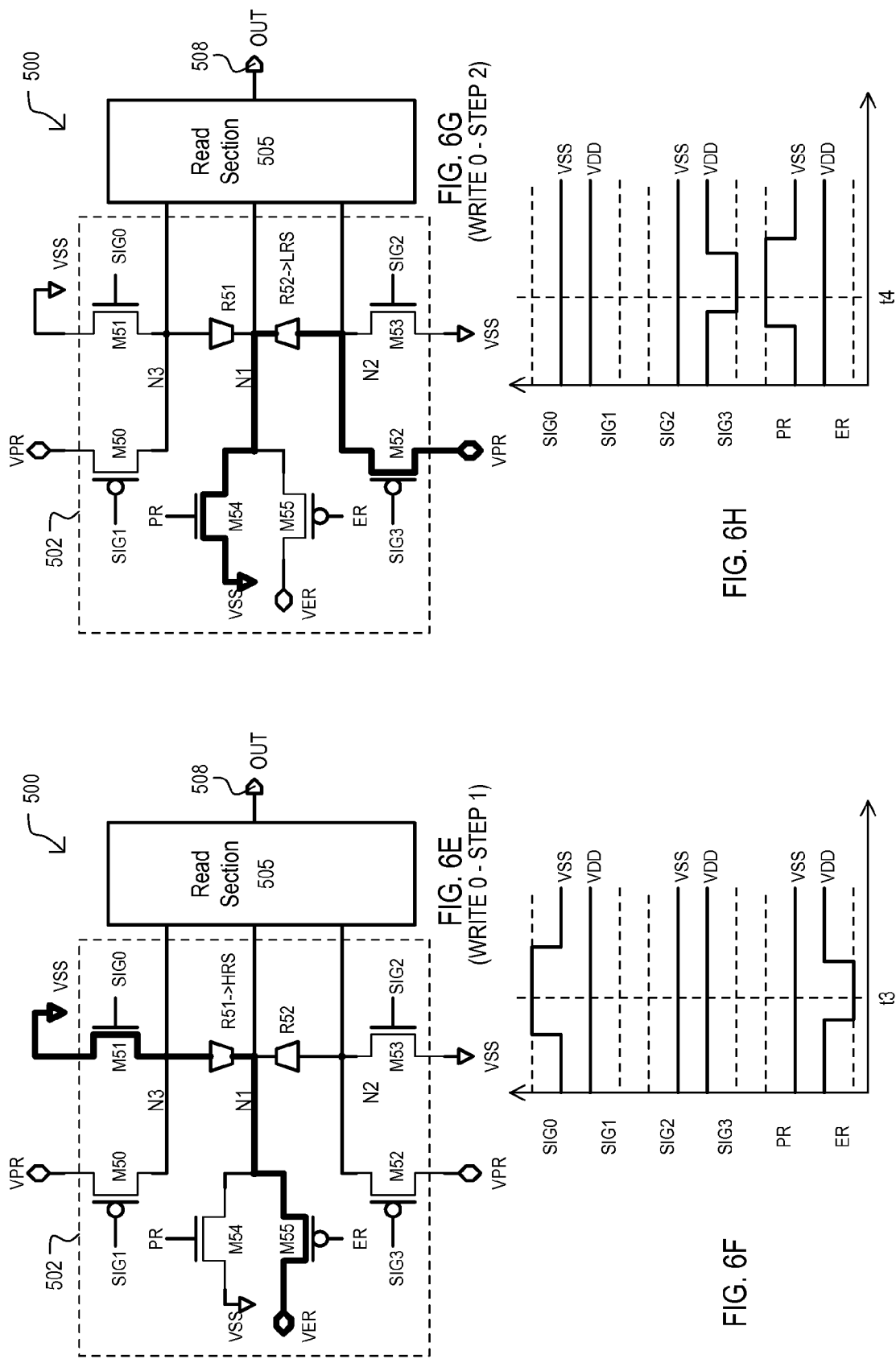

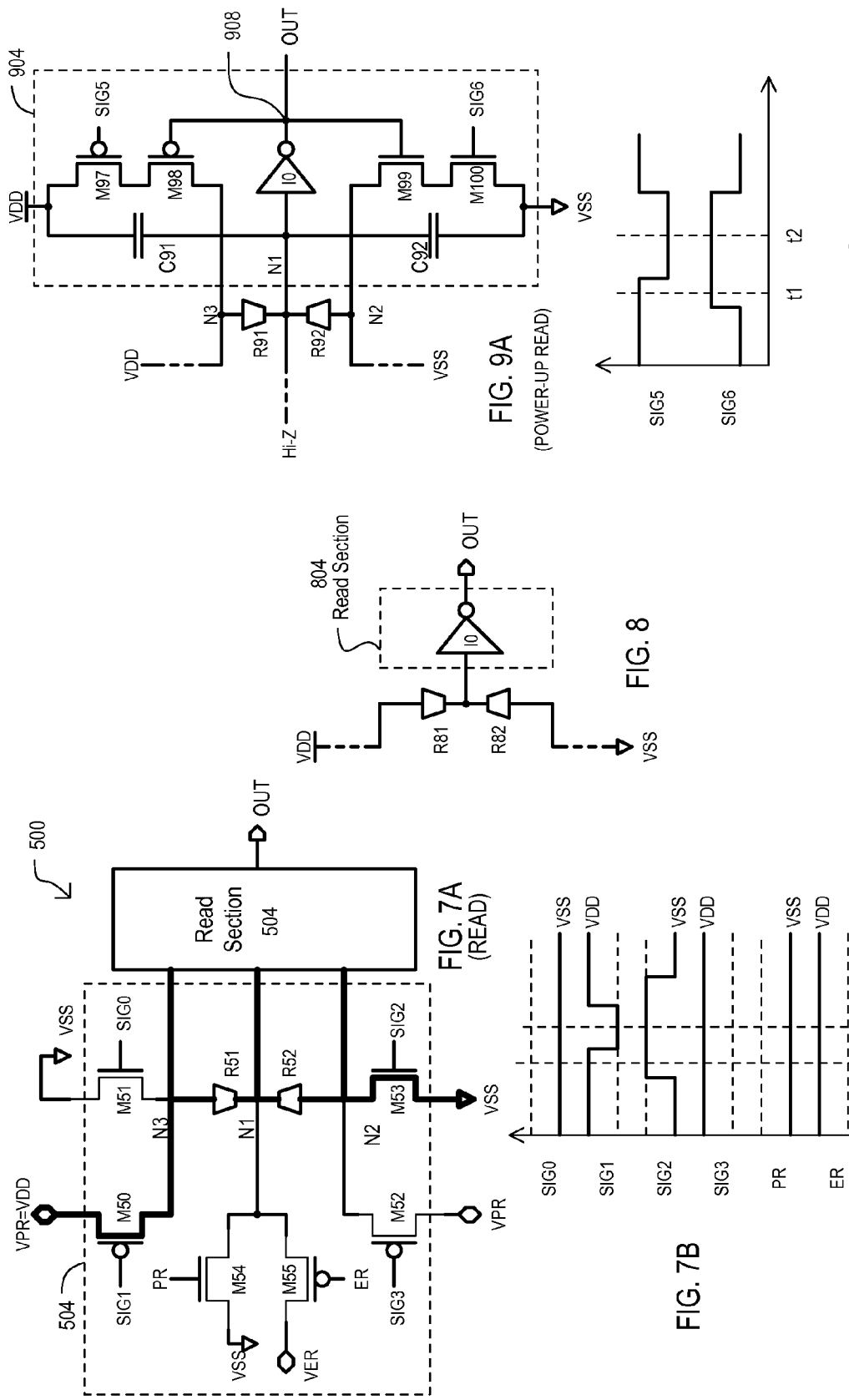

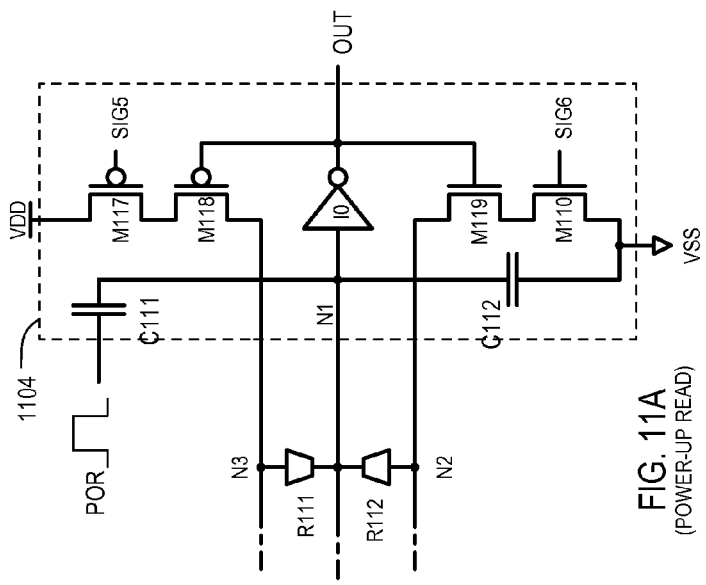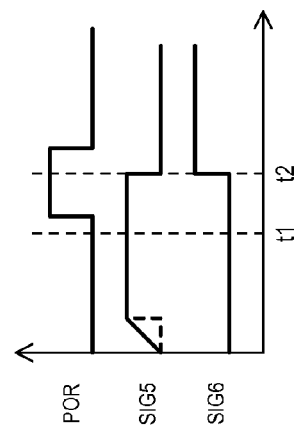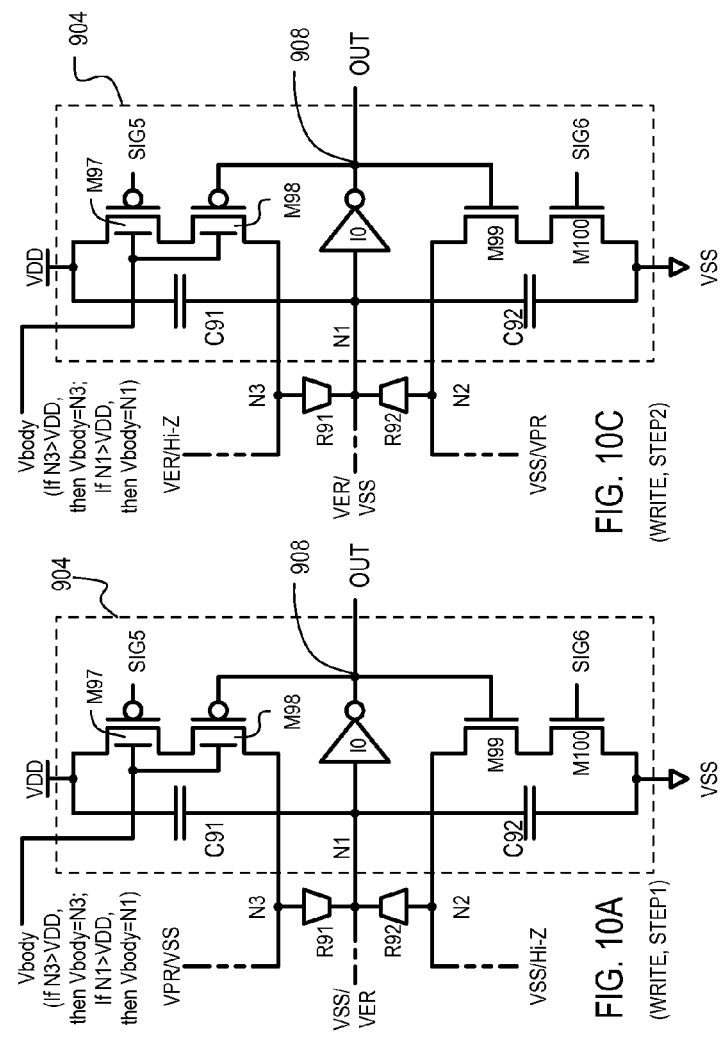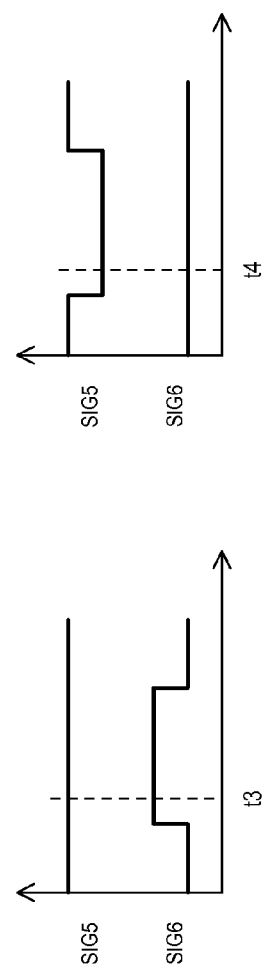

LATCH CIRCUITS AND METHODS WITH PROGRAMMABLE IMPEDANCE ELEMENTS

This application claims the benefit of U.S. provisional patent application Ser. No. 61/762,705, filed on Feb. 8, 2013, the contents of which are incorporated by reference herein.

TECHNICAL FIELD

The present disclosure relates generally to circuits that store data with programmable impedance elements, and more particularly to latch circuits that can store data with programmable resistance elements.

BRIEF DESCRIPTION OF THE DRAWINGS

FIG. 1 includes diagrams showing a circuit and corresponding operations according to one embodiment.

FIGS. 2A to 2C-4 are diagrams showing a circuit having two programmable impedance elements, and corresponding operations according to other embodiments.

FIGS. 4A to 4F-4 are diagrams showing a circuit having two programmable impedance elements, and corresponding operations according to embodiments.

FIGS. 5A and 5B are diagrams showing a circuit having two programmable impedance elements, and a corresponding standard mode of operation according to an embodiment.

FIGS. 6A to 6H are diagrams showing the circuit of FIG. 5A and corresponding write modes of operation, according to embodiments.

FIGS. 7A and 7B are diagrams showing the circuit of FIG. 5A and a corresponding read mode of operation, according to an embodiment.

FIG. 8 is a schematic diagram of a read section that can be included in embodiments.

FIGS. 9A and 9B are diagrams showing a read section and a corresponding read mode of operation, according to an embodiment.

FIGS. 10A to 10D are diagrams showing the read section of FIG. 9A in write modes of operation, according to embodiments.

FIGS. 11A and 11B are diagrams showing a read section mode and a corresponding read mode of operation, according to another embodiment.

DETAILED DESCRIPTION

Figures 1, 2C:
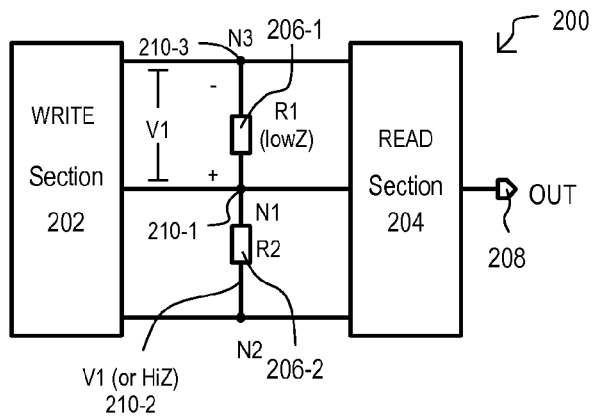

Embodiments disclosed herein show circuits incorporating programmable impedance elements that can be set with data states that can establish the state of a latch circuit, or the like (i.e., loaded into a latch circuit). Circuits according to embodiments herein can have a standard mode, write mode, and read mode. In a standard mode, a current through the element(s) and/or a voltage across the element(s) can be essentially zero. In a write mode, the impedance of the element(s) can be set, to thereby establish the data stored by the element(s). In a read mode, data can be read from an element and maintained by a latch circuit, or the like.

In particular embodiments, programmable impedance elements can be programmable resistance elements that are programmable between two or more different impedance states. In particular embodiments, such elements can be conductive bridging random access memory (CBRAM) type memory) that include a metal oxide layer and/or chalcogen based layer, programmable between different resistance states. Further, according to embodiments, elements can be two terminal elements.

In the various embodiments disclosed herein, like items are referred to by the same reference characters, but with the leading digits corresponding to a figure number.

FIG. 1 is a block schematic diagram showing a circuit 100 and various modes of operation (105) for the circuit, according to an embodiment. A circuit 100 can include one or more programmable elements 106 (one shown as R1), a write section 102 and a read section 104.

A programmable element R1 can be programmed between two or more different impedance states. Impedance states can include variations in resistance, capacitance, or combinations thereof. Impedance states can be static or dynamic. A static impedance state can be one that remains substantially unchanged in a sensing operation. A dynamic impedance state can be one that changes in a sense operation (e.g., in a sense operation one impedance state changes from high to low, while another remains at a high impedance). According to embodiments, an element can be any of: a two terminal element; an element programmable between different impedance states by application of electric fields; an element that includes a programmable layer, for example a chalcogenide and/or a metal oxide. Elements 106 can retain an impedance state in a nonvolatile fashion (i.e., retain data without the application of power). Such retention can be for time periods on the order of hours, days, years, or many years.

A circuit 100 can be conceptualized as having different modes of operation, shown in table 105. Table 105 shows different modes: Standard, Read, and Write (including a Write 0 and Write 1). For each of these modes, a current through the element is shown (I_Element) as well as a voltage across the element (V_Element).

In the standard mode, a read section 102 can output a data value OUT on an output 108 that corresponds to an impedance state of the element(s) 106. However in the standard state, there is essentially no current flowing through the element(s) 106 and/or there is substantially no voltage applied across the element(s) 106. Such an arrangement can result in: increased data retention and/or more reliable data retention as the elements are not subject to "disturb" conditions (e.g., applied voltages or current flows less than those that typically program the element, but that can affect the element eventually). In a standard mode, elements 106 can be subject to various conditions resulting in the no current and/or no voltage state. Such conditions include, but are not limited to: coupling one terminal of the element to a biased node, while allowing the other terminal to float (e.g., electrically isolating it); coupling both terminals of the element to a same voltage; or isolating both terminals of the element. Such configurations are implemented by operation of the read section 104 and write section 102, or the two in combination with one another.

In the read mode, a read section 104 can store a data value based on the impedance state of the element(s). According to embodiments, in a read mode, element(s) 106 can be temporarily connected to the read section 104 until a state is sensed, the circuit 100 can then return to the standard mode. A read section 104 can include a latch circuit that can latch one of two different states in response to the impedance states of the element(s) 106. In a read mode, a write section 102 can be electrically isolated from the element(s). In some embodiments, in a read mode, a temporary read voltage can be developed on the power-up/reset of a device to determine a state of the element(s) 106, which can then be stored by a read section 104. Once such a data value is stored (e.g., latched) by a read section 104, the read voltage is no longer applied to the element(s) 106.

In the write modes, element(s) 106 of a circuit 100 can be placed into particular impedance states, corresponding to a data value to be stored. A write section 102 can apply electrical conditions that result in a current (I1 or I2) through and/or voltage (V1 or V2) across element(s) 106 that can results in element(s) 106 being placed into a desired impedance state. In some embodiments, current I1 can be opposite to that of I2 and voltage V1 can be opposite in polarity (with respect to terminals of element(s)) than V2. In some embodiments, a read section 104 can be electrically isolated from the element(s) 106 in the write modes. However, in other embodiments, a read section 104 can reinforce applied write conditions. According to embodiments, in the write modes, write conditions are only temporarily applied to the element(s) 106, and once a write operation is complete, a circuit 100 can return to the standard mode (i.e., a mode in which no current and/or voltage is applied to the element(s)).

As noted above, while some embodiments can store data states with one element, in other embodiments a data state can be stored with multiple elements. FIGS. 2A to 2C-4 are diagrams showing modes of operation of a circuit 200 that can store a data value with two elements 206-1/2 set to different impedance states.

A circuit 200 can have sections like those of FIG. 1, and in very particular embodiments, can be one implementation of that shown in FIG. 1. In the embodiments of FIGS. 2A to 2C-4, a circuit 200 can include two elements 206-1/2 (R1/R2) arranged in series with one another. One element R2 can be connected between a first node N1 (210-1) and a second node N2 (210-2), while the other element R1 can be connected between the first node N1 and a third node N3 (210-3).

FIG. 2A shows a read mode (READ). In a read mode, voltages can be developed across elements R1/R2. Due to a difference in impedance states of the elements R1/R2 (i.e., the elements have previously been programmed to different impedance states), a voltage can be developed across one element that is different than that developed across the other element. A read section 204 can detect such differences and provide an output value (OUT) corresponding to the impedance states. One particular example is shown in table 205A. In some embodiments, a voltage across the elements R1/R2 can be developed on the power-up/reset of a device that includes circuit 200. In particular embodiments, a power supply can be applied across the elements R1/R2. In a read mode, element(s) are only temporarily connected to the read section 204.

FIG. 2B shows a standard mode (STANDARD). In a standard mode, a read section 204 can output a data value OUT on output 208 that corresponds to an impedance state of the element(s) R1/R2. At the same time, as shown by table 205B, while such a data value is output, there is essentially no current flowing through the element(s) and/or there is substantially no voltage applied across the element(s). Such conditions can be established as described for the other embodiments herein, or equivalents.

FIG. 2C-1 shows a first step in an operation that writes a first data value (WRITE0, Step 1) into elements R1/R2. In the particular embodiment shown, a first voltage (V1) can be applied to first element (R1) that places it into a low impedance state. In the example shown, V1 can be positive at node N1 with respect to node N3. During this operation, an opposing terminal of the other element (node N2) can be in a high impedance state (HiZ) or can be biased to the same (or about the same) potential as node N1, thus preventing a voltage from being developed across the second element R2.

Figures 2, 2C:
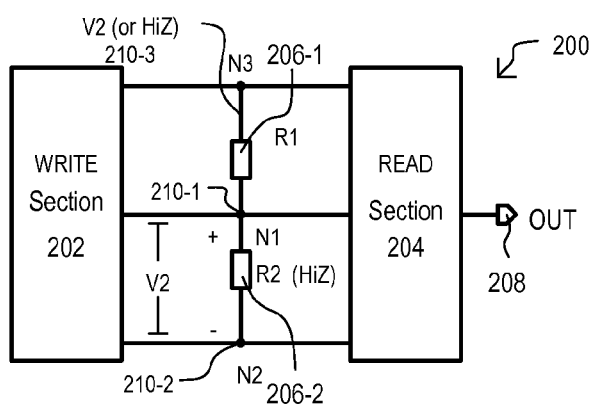

FIG. 2C-2 shows a second step in an operation that writes the first data value (WRITE0, Step 2). In the write operation, a second voltage (V2) can be applied that places a second element R2 into a higher impedance than the first element R1. In the example shown, a voltage V2 can be positive at node N1 with respect to node N2. During this operation, the opposing terminal of the other element (node N3) can be in a high impedance state (HiZ) or be biased to the same (or about the same) potential as node N1. In some embodiments, a magnitude of V2 is different from that of V1. However, in other embodiments, a magnitude of such voltages can be about the same.

It is noted that a second step shown in FIG. 2C-1 could precede a first step shown in FIG. 2C-2. That is, the elements R1/R2 can be programmed to the impedance states in the reverse order of that shown in FIGS. 2C-1 and 2C-2.

FIGS. 2C-3 and 2C-4 show the programming of a state opposite to that of FIGS. 2C-1 and 2C-2. The operations are understood from the previous description. In particular, in FIG. 2C-3 a voltage (−V2) can be applied to first element (R1) that places it into a high impedance state. During this operation, an opposing terminal of the other element (node N2) can be in a high impedance state (HiZ) or can be biased to the same (or about the same) potential as node N1, thus preventing a voltage from being developed across the second element R2. In FIG. 2C-4, a voltage (V1) can be applied to second element (R2) that places it into a low impedance state. During this operation, an opposing terminal of the other element (node N3) can be in a high impedance state (HiZ) or can be biased to the same (or about the same) potential as node N1, thus preventing a voltage from being developed across the second element R1.

Figures 2, 2C, 3:
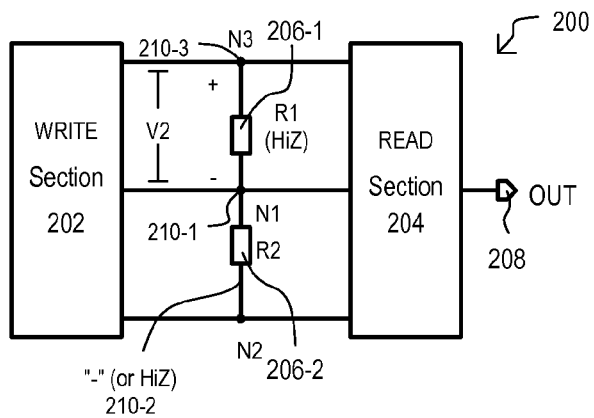

It is noted that a second step shown in FIG. 2C-4 could precede a first step shown in FIG. 2C-3.

Figure 3A:
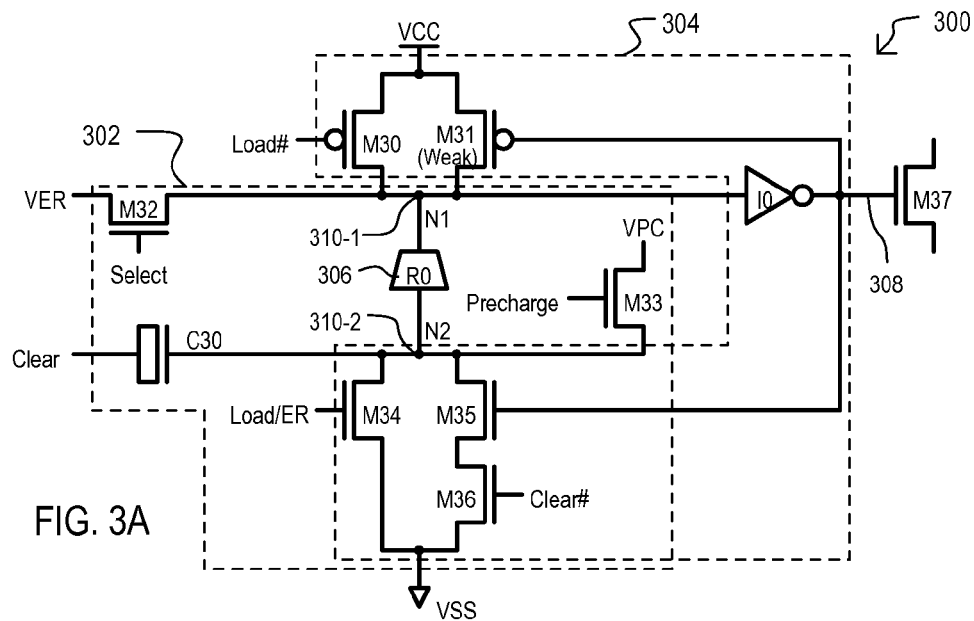
FIGS. 3A to 3G are diagrams showing a circuit having one programmable impedance element, and corresponding operations according to further embodiments.

FIG. 3A is a schematic diagram of a circuit 300 according to another embodiment. In very particular embodiments, circuit 300 can be one implementation of that shown in FIG. 1. The circuit 300 shown can be conceptualized as including a read section 304, a write section 302, an element R0, and an output device M37. Element R0 can be programmable between a high resistance state (HRS) and a low resistance state (LRS) and can be connected between nodes N1 (310-1) and N2 (310-2).

A read section 304 can include transistors M30, M31, M34, M35, M36, and an inverter I0. Such elements can form a latch circuit that can latch a data value based on a state of R0. Transistors M30/M31 can be p-channel transistors having sources connected to a high power supply node (VCC) and drains connected to node N1 (310-1). A gate of transistor M30 can receive a signal Load#. Inverter I0 can have an input connected to node N1 and an output that drives the gate of transistor M31 and output node 308. Transistors M35 and M36 can be n-channel transistors in series between a node N2 (310-2) and a low power supply node (VSS). A gate of transistor M35 can be connected an output of inverter I0. A gate of transistor M36 can receive signal Clear#. Transistor M34 can be an n-channel transistor arranged in parallel with transistors M35/M36 between N2 and VSS.

A write section 302 can include transistors M32, M33, M35, M36, and a capacitor C30. A write section 302 can apply electrical conditions that place element R0 into one of multiple impedance states. Transistor M32 can be an n-channel transistor with a gate that receives a signal Select, and a source-drain path connected between an erase voltage source VER and node N1. Transistor M33 can be an n-channel transistor with a gate that receives a signal Precharge, and a source-drain path connected between node N2 and a precharge voltage source VPC. Capacitor C30 can have one terminal connected to node N2 and another that receives a signal Clear.

Output device M37 can be a transistor controlled by a state of read section 104 (i.e., a data value latched by read section 104). In very particular embodiments, transistor M37 can be part of a programmable logic circuit, such as a signal path in a programmable logic device (e.g., field programmable gate array, FPGA). Thus, a signal path provided by output device M37 can be controlled by a data value stored in read section 104.

Figure 3B:
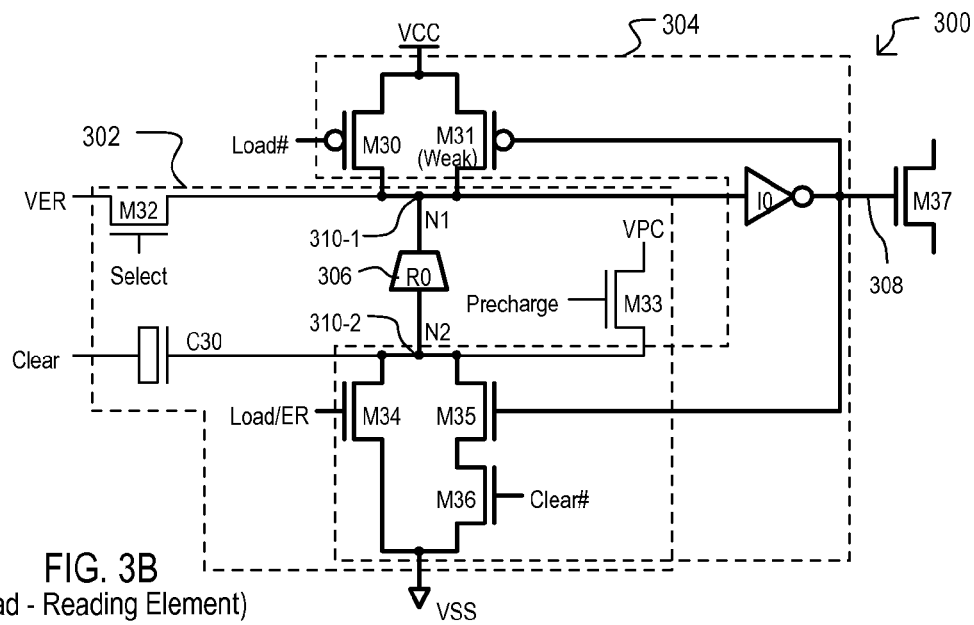
Figure 3C:
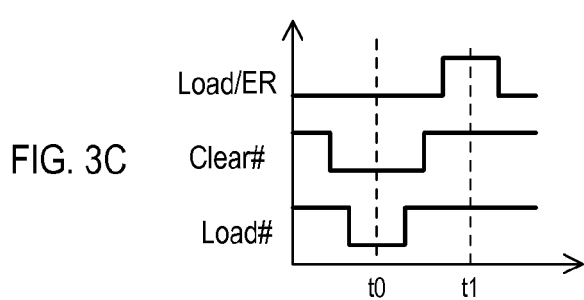

FIGS. 3B and 3C show a read or "load" mode for circuit 300. FIG. 3B is a circuit diagram showing transistors that may be in operation in the read mode. FIG. 3C is a timing diagram showing signals Load/ER, Clear# and Load#.

At time t0, a low signal Clear# can turn off transistor M36 and a low signal Load# can turn on transistor M30. Regardless of a resistance state element R0, node N1 can be precharged to a high voltage level. Inverter I0 can drive output 308 low, turning on transistor M31.

At time t1, signal Load/ER can go high, turning on transistor M34. If element R0 has a HRS state, node N2 can be pulled low. However, due to the HRS state, node N1 can remain high. Inverter I0 can continue to drive output 308 low, keeping transistor M31 off, and latching the HRS state (i.e., output 308 latched low). After signal Load/ER returns low, while node N1 may be latched high, node N2 can be floating as transistor M35 is turned off. Thus, a potential is not maintained across element R0.

However, if element R0 is in the LRS at time t1, transistor M31 can be a weak device, which is overpowered by series combination of transistor M34 and R0. This results in node N1 being pulled low. Inverter I0 can drive output 308 high, turning off M31 and turning on transistor M35. Because transistor M36 is also on at this time, the LRS state can be latched (i.e., output 308 latched high). After signal Load/ER returns low, while node N2 may be latched low. Transistors M30 and M31 are turned off. Since R0 has LRS state and node N1 is not actively pulled high, node N1 can follow the potential at node N2. Thus, a potential is not maintained across element R0.

Figure 3D:
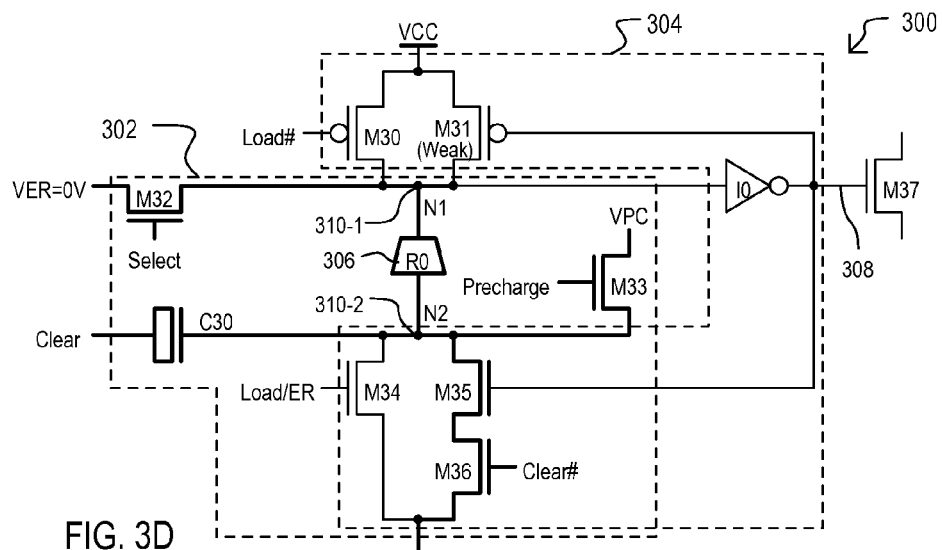
Figure 3E:
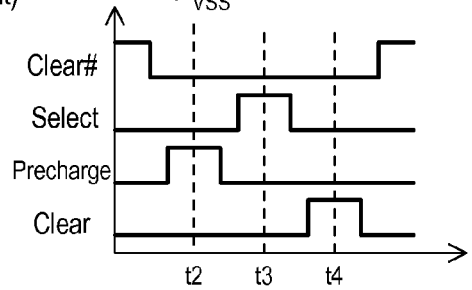

FIGS. 3D and 3E show a clear or "program" mode for circuit 300. FIG. 3D is a circuit diagram showing transistors that may be in operation in the clear mode. FIG. 3E is a timing diagram showing signals Clear#, Select, Precharge, and Clear.

At time t2, signal Precharge can go high, applying a precharge voltage VPC to one terminal (i.e., node N2) of the element R0. In some embodiments, such a node can be an anode of a CBRAM type element.

At time t3, signal Select can go high, turning on transistor M32. An erase voltage source VER can be at a low voltage (0 V, in this embodiment), applying such a voltage to an opposing terminal (i.e., node N1) of element R0. In some embodiments, such a node can be a cathode of a CBRAM type element.

At time t4, signal Clear can pulse high, applying such a signal to capacitor C30. By applying a pulse to capacitor C30, a voltage at node N2 can be "pumped" or "boot-strapped" to a voltage higher than VPC. Such a voltage can be sufficient to place the element R0 in a first resistance state. In the particular embodiment, shown, the state can be the LRS.

Figure 3F:
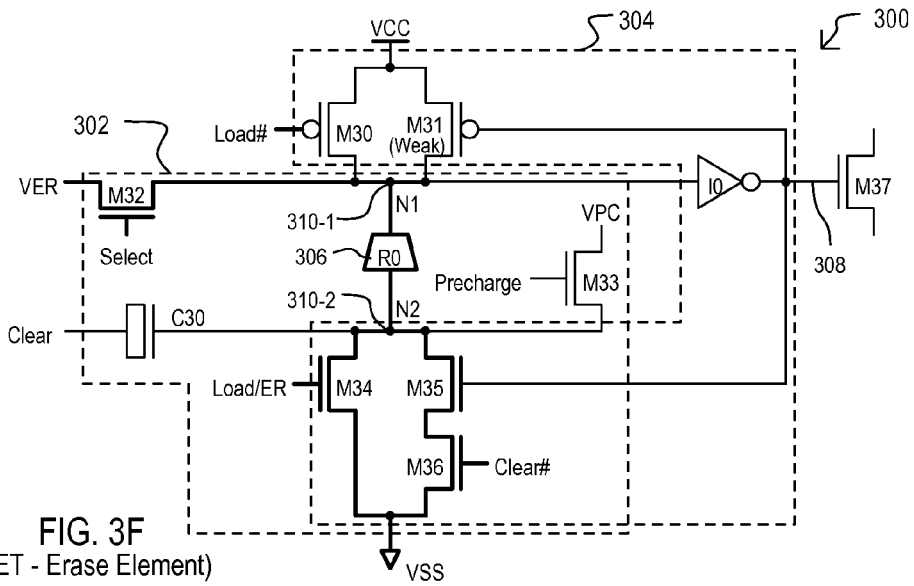
Figure 3G:
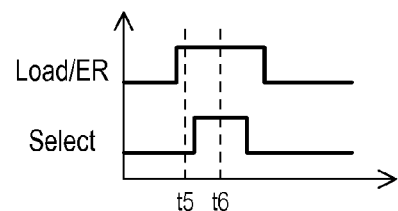

FIGS. 3F and 3G show a set or "erase" mode for circuit 300. FIG. 3F is a circuit diagram showing transistors that may be in operation in the set mode. FIG. 3G is a timing diagram showing signals Load/ER and Select.

At time t5, signal Low/ER can go high, turning on transistor M34 to connect node N2 to VSS.

At time t6, signal Select can to high connecting VER to node N1. VER can be at a high voltage. Thus, element R0 can have one terminal (N2) at VSS and the other terminal (N1) at a high erase voltage. Such a voltage can be sufficient to place the element R0 in a second resistance state. In the particular embodiment shown, such a second resistance state can be the HRS. Signal Select can be sufficiently high to ensure VER is sufficiently high (i.e., overcome any threshold voltage drop) to ensure element R0 is erased to the HRS state.

Figures 4A, 4B, 4C:
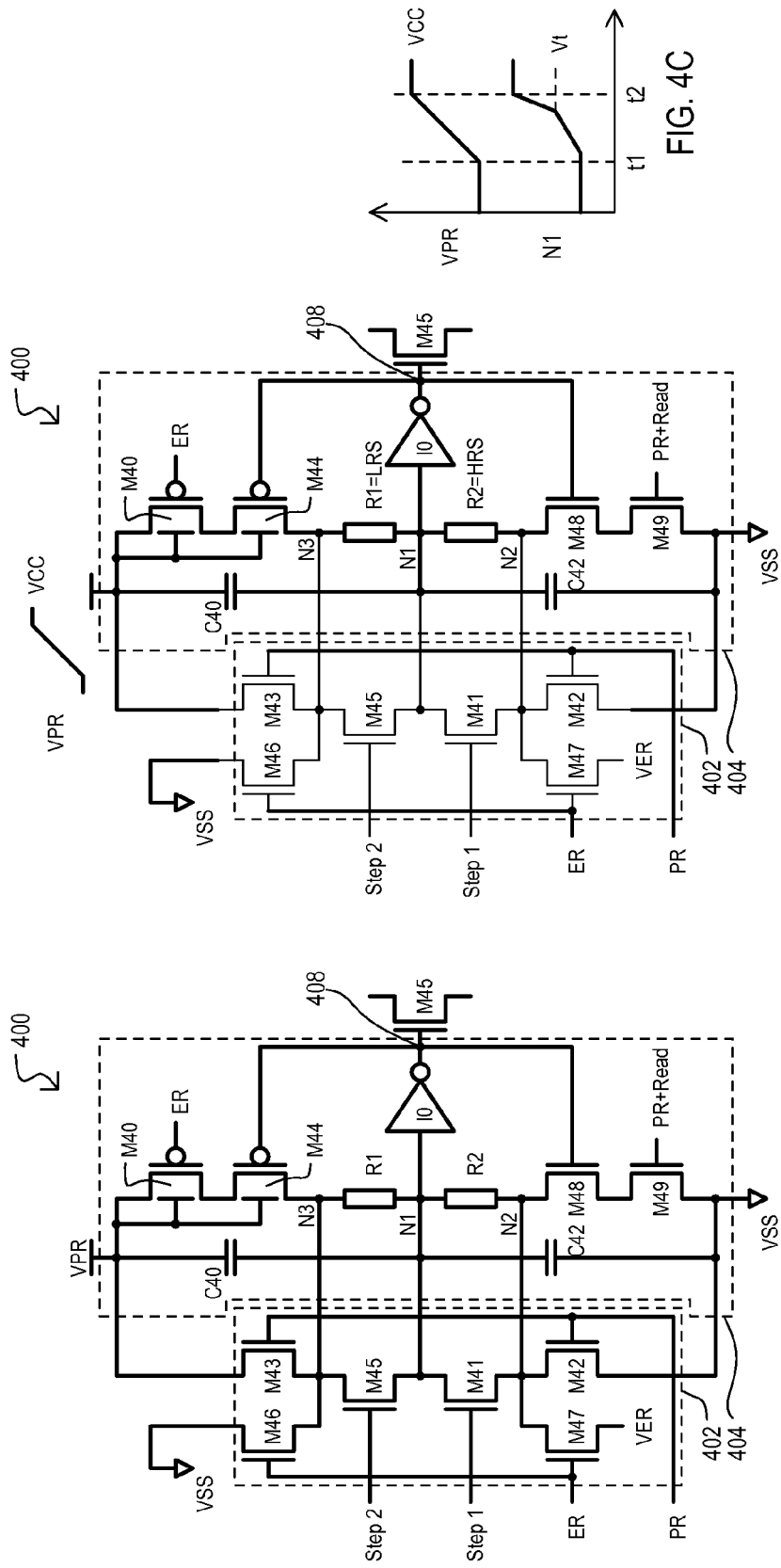

FIG. 4A is a schematic diagram of a circuit 400 according to another embodiment. In very particular embodiments, circuit 400 can be one implementation of that shown in FIG. 2A. The circuit 400 shown can be conceptualized as including a read section 404, a write section 402, and an output device M45. Data of circuit 400 can be established by programmable resistance elements R1/R2. Elements R1/R2 can be programmable between a high resistance state (HRS) and a low resistance state (LRS). Element R1 can be connected between nodes N1 and N3. Element R2 can be connected between nodes N1 and N2.

Read section 404 can include p-channel transistors M40, M44, n-channel transistors M48, M49, capacitors C40, C42, and inverter I0. Transistors M40 and M44 can be arranged in series between a program voltage source VPR and node N3, and have their bodies connected to VPR. A gate of transistor M40 can receive a signal ER. A gate of transistor M44 can receive the output of inverter I0. Transistors M48 and M49 can be arranged in series between a low power supply node VSS and node N2. A gate of transistor M49 can receive a signal PR+Read. A gate of transistor M48 can receive the output of inverter I0. Inverter I0 can have an input connected to node N1. Capacitor C40 can be connected between VPR and node N1. Capacitor C42 can be connected between VSS and node N1.

Write section 402 can include n-channel transistors M41, M42, M43, M45, M46 and M47. Transistor M43 can have a source-drain path connected between VPR and node N3, and a gate that receives a signal PR. Transistor M46 can have a source-drain path connected between VSS and node N3, and a gate that receives signal ER. Transistor M45 can have a source-drain path connected between nodes N3 and N1, and a gate that receives signal Step 2. Transistor M41 can have a source-drain path connected between nodes N1 and N2, and a gate that receives signal Step 1. Transistor M47 can have a source-drain path connected between an erase voltage source VER and node N2, and a gate that receives signal ER. Transistor M42 can have a source-drain path connected between VSS and node N2, and a gate that receives signal PR.

Output device M45 can be a transistor controlled by a state of read section 404 (i.e., output of inverter I0). In very particular embodiments, transistor M45 can be part of a programmable logic circuit as described for other embodiments herein, or equivalents.

FIGS. 4B and 4C show a load mode for the circuit of FIG. 4A. FIG. 4B is a circuit diagram showing transistors that may be in operation in the load mode. FIG. 4C is a timing diagram showing a VPR level and a potential at node N1. In the load mode of FIGS. 4B and 4C, an output 408 of the read section 404 is driven according to the resistance states of elements R1/R2 as a power supply (i.e., VPR) rises.

In the operation shown, it is assumed that element R1 has the LRS and element R2 has the HRS. Further, signals ER, PR, Step 1 and Step 2 can be low, and signal PR+Read can be high.

At time t1, VPR will start rising toward VCC. In some embodiments, this can represent a power-on reset (POR) type operation of a device that includes circuit 400. As VPR rises, capacitors C40/042 can operate as a transient voltage divider, thus a voltage at node N1 will also start to rise.

At time t2, once a voltage at node N1 reaches a threshold voltage, due to the LRS of element R1, element R1 and transistors M44/M40 can shunt capacitor C40, pulling node N1 to the VPR level (i.e., VCC at the end). Inverter I0 can drive its output low, turning off device M45.

FIGS. 4D and 4E show a same load mode for the circuit 400 as in FIGS. 4B and 4C, but for the case where element R1 has the HRS and element R2 has the LRS.

At time t3, VPR will start rising toward VCC and capacitors C40/042 can operate as a transient voltage divider as noted above.

At time t4, once a voltage at node N1 reaches a threshold voltage, due to the LRS of element R2, element R2 and transistors M48/M49 can shunt capacitor C42, pulling node N1 to the VSS level. Inverter I0 can drive its output high, turning on device M45.

Figures 3, 4F:
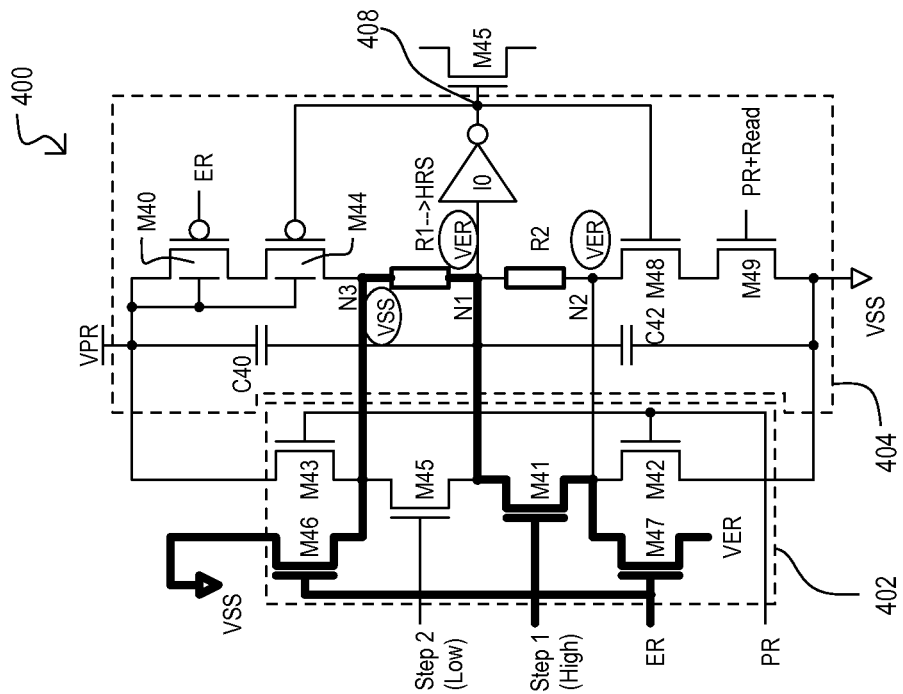
Figures 2, 4F:
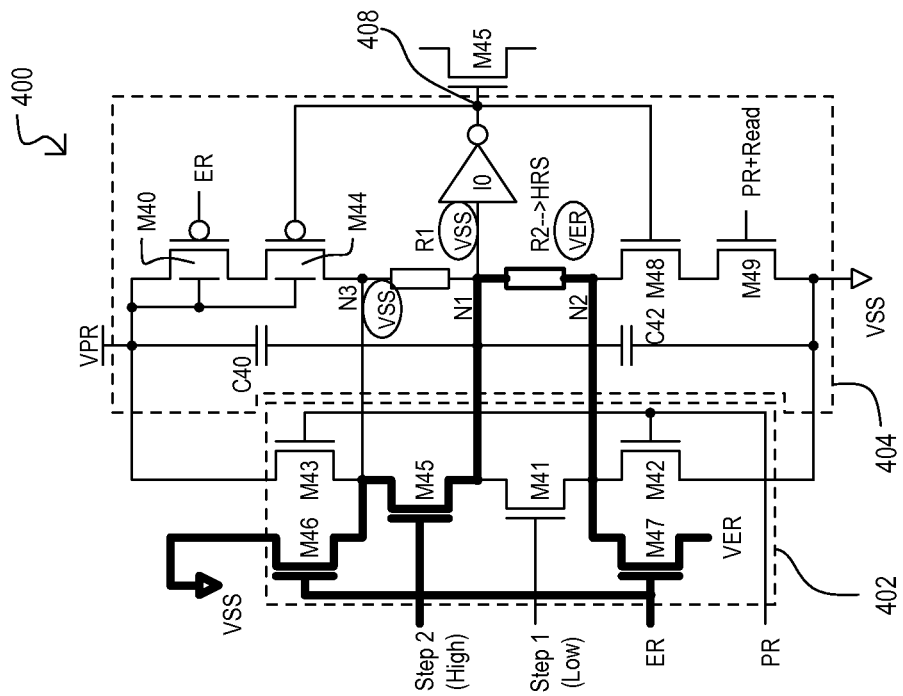

FIGS. 4F-1 and 4F-2 show a write mode for the circuit 400 to store a particular data value. The data value is represented by placing element R1 into the LRS and placing element R2 into the HRS.

FIG. 4F-1 shows element R1 being placed in to the LRS. VPR can be set to a high voltage, sufficient to program element R1 into the LRS. Signal ER can be low, turning off transistors M46 and M47. Signal Step 2 can be low, turning of transistor M45. Signal PR can be high, turning on transistor M43 to apply VPR to node N3, and turning on transistor M42. Signal Step 1 can be high, turning on transistor M41. As a result, VSS is applied node N1, as well as N2, via transistors M41/M42.

It is noted that such a write operation applies a positive program voltage VPR to a first terminal of element R1, and VSS to second terminals of R1/R2 (node N1). Element R2 has VSS applied to both its terminals, which can prevent disturb.

FIG. 4F-2 shows element R2 being placed into the HRS. VER can be set to a high voltage, sufficient to erase an element to the HRS. Signal PR can be low, turning off transistors M42 and M43. Signal Step 1 can be low, turning off transistor M41. Signal ER can be high, turning on transistors M46 and M47. Signal Step 2 can be high, turning on transistor M45. As a result, VSS is applied node N1, as well as node N3, via transistors M45/M46. VER can be applied to node N2 via transistor M47.

It is noted that such a write operation applies a positive erase voltage VER to a first terminal of R2 and VSS to second terminals of R1/R2 (node N1). Element R1 has VSS applied to both its terminals, which can prevent disturb.

It is understood that the operations shown in FIGS. 4F-1 and 4F-2 can be performed in the reverse order.

Figures 2, 2C, 3, 4:
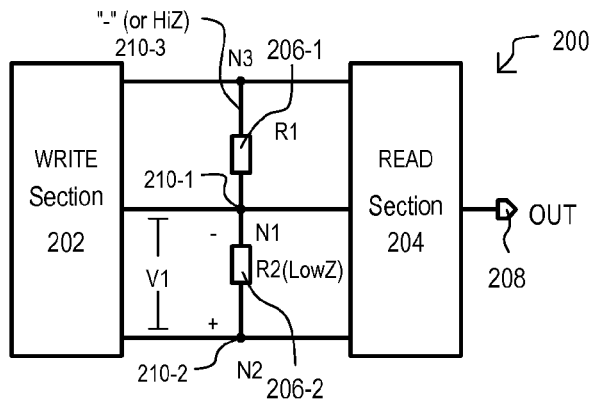

FIGS. 4F-3 and 4F-4 show a write mode for the circuit 400 to store another particular data value. The data value is represented by placing element R1 into the HRS and placing element R2 into the LRS.

FIG. 4F-3 shows element R1 being placed into the HRS. VER can be set to a high voltage, sufficient to erase an element to the HRS. Signal PR and Step 2 can be low, turning off transistors M42, M43, and M45. Signal ER can be high, turning on transistors M46 and M47. Signal Step 1 can be high, turning on transistor M41.

As a result, VSS is applied node N3 via transistor M46. VER can be applied to nodes N1 and N2 via transistors M41 and M47.

It is noted that such a write operation applies VSS to a first terminal of R1 and VER to second terminals of R1/R2 (node N1). Element R2 has VER applied to both its terminals, which can prevent disturb.

FIG. 4F-4 shows element R2 being placed in to the LRS. VPR can be set to a high voltage, sufficient to program element R2 into the LRS. Signals ER and Step 1 can be low, turning off transistors M41, M46 and M47. Signal PR can be high, turning on transistors M42 and M43. Signal Step 2 can be high, turning on transistor M45. As a result, VPR can be applied to nodes N1 and N3 via transistors M43/M45 and VSS can be applied to node N2 via transistor M42.

It is noted that such a write operation can apply VSS to a first terminal of R2 (node N2) and a positive program voltage VPR to second terminals of R1/R2 (node N1). Element R1 has VPR applied to both its terminals, which can prevent disturb.

FIGS. 5A and 5B are diagrams showing a circuit 500 according to another embodiment. FIG. 5A is a schematic diagram of circuit 500. FIG. 5B is a timing diagram showing signals for the circuit 500 in a standard mode. In a particular embodiments, the circuit of FIGS. 5A and 5B can be one implementation of that shown in FIG. 2A.

A circuit 500 can include a write section 502, a read section 504, and two programmable impedance elements R51/R52. A write section 502 can include p-channel transistors M50, M52, M55 and n-channel transistors M51, M53, M54. Transistor M50 has a source-drain path between a program voltage source VPR and node N3, and a gate that receives a signal SIG1. Transistor M51 has a source-drain path between a low power supply VSS and node N3, and a gate that receives a signal SIG0. Transistor M52 has a source-drain path between VPR and node N2, and a gate that receives a signal SIG3. Transistor M53 has a source-drain path between VSS and node N2, and a gate that receives a signal SIG2. Transistor M54 has a source-drain path between VSS and node N1, and a gate that receives a signal PR. Transistor M55 has a source-drain path between an erase voltage source VER and node N1, and a gate that receives a signal ER.

Element R51 is connected between nodes N1 and N3. Element R52 is connected between nodes N1 and N2.

A read section 504 can generate an output value OUT based on sensing states of elements R51/R52. Read sections according to particular embodiments will be described in more detail below. In the standard mode, a read section 504 can ensure that substantially no current is flowing through elements (R51/R52) and no potential is applied across elements R51/R52.

As shown in FIG. 5B, with SIG0, SIG2 and PR low, and SIG1, SIG3 and ER high, all the transistors are turned off, thus elements R51/R52 are isolated from any bias conditions of the write section 502 with high impedance paths (transistors turned off). In some embodiments, a read section 504 can provide the same sort of high impedance isolation to the elements R51/R52. In other embodiments, read section 504 can provide a same bias to both terminals of an element R51/R52.

FIGS. 6A to 6D are diagrams showing a first write mode for circuit 500. Such a mode can place element R51 into one impedance state (in this case a LRS) and element R52 into another impedance state (in this case HRS).

FIGS. 6A and 6B show circuit 500 and corresponding signals that place element R51 into the LRS. Prior to time t1, the various signals can have values as shown in FIGS. 5A and 5B. Further, VPR can be a voltage sufficient to program an element to the LRS.

At time t1, signal SIG1 can be low and signal PR can be high. As a result, transistor M50 can turn on, applying VPR to node N3, and transistor M54 can be on, applying VSS to node N1. Node N2 can remain isolated with high impedance paths. As a result, element R51 can be programmed to the LRS.

FIGS. 6C and 6D show circuit 500 and corresponding signals that place element R52 into the HRS. Prior to time t2, the various signals can have values as shown in FIGS. 5A and 5B. Further, VER can be a voltage sufficient to erase an element to the HRS.

At time t2, signal SIG2 can be high and signal ER can be low. As a result, transistor M55 can turn on, applying VER to node N1, and transistor M53 can be turned on, applying VSS to node N2. Node N3 can remain isolated with high impedance paths. As a result, element R52 can be programmed to the HRS.

FIGS. 6E to 6H are diagrams showing a second write mode for circuit 500. Such a mode can place element R51 into the other impedance state (e.g., HRS) and element R52 into the one impedance state (e.g., LRS).

FIGS. 6E and 6F show circuit 500 and corresponding signals that place element R51 into the HRS. Prior to time t3, the various signals can have values as shown in FIGS. 5A and 5B. Further, VER can be a voltage sufficient to erase an element to the HRS.

At time t3, signal SIG0 can be high and signal ER can be low. As a result, transistor M51 can turn on, applying VSS to node N3, and transistor M55 can be on, applying VER to node N1. Node N2 can remain isolated with high impedance paths. As a result, element R51 can be programmed to the HRS.

FIGS. 6G and 6H show circuit 500 and corresponding signals that place element R52 into the LRS. Prior to time t4, the various signals can have values as shown in FIGS. 5A and 5B. Further, VPR can be a voltage sufficient to program an element to the LRS.

At time t4, signal SIG3 can be low and signal PR can be high. As a result, transistor M52 can turn on, applying VPR to node N2, and transistor M54 can be turned on, applying VSS to node N1. Node N3 can remain isolated with high impedance paths. As a result, element R52 can be programmed to the LRS.

As in the various embodiments above, the order by which an impedance for elements R51/R52 are set, can vary.

FIGS. 7A and 7B are diagrams showing a read mode for circuit 500. Such a mode can determine the impedance states of element R51/52. FIG. 7A shows the circuit 500. FIG. 7B is a timing diagram showing various signals. In the read mode, VPR can be at a lower voltage level (in this case VDD). That is, VPR is not at a level that can program an element (e.g., R51/R52).

At time t5, signal SIG2 can be high, turning on transistor M53, connecting node N2 to VSS.

At time t6, signal SIG1 can be low, turning on transistor M50, connecting VDD to node N3. As a result, elements R51/R52 can operate as voltage dividers based on their impedance states. A read section 504 can generate an output value OUT on output 508 corresponding to the voltages on nodes N1, N2 and N3.

In some embodiments, VDD can be a supply voltage that can ramp-up when a device is first powered-up or subject to a "hard" reset.

FIG. 8 is a block schematic diagram shows a read section 804 that can be included in embodiments, including that shown in FIGS. 5A to 7B. A read section 804 can include a detect circuit that can determine a difference in potential created by a voltage dividing action of the elements (R81/R82). Such a circuit can include any suitable comparator-like circuit. In the embodiment shown, a detect circuit can be an inverter I0, relying on threshold voltages of its transistors.

FIGS. 9A and 9B are a schematic diagram and timing diagram showing another read section 904 that can be included in embodiments, including that shown in FIGS. 5A to 7B. A read section 904 can include a configuration like that of FIGS. 4A to 4B. FIGS. 9A and 9B show a read mode. The operation is understood from the waveforms and previous embodiments. In some embodiments, FIG. 9B timings can occur as shown at time t6 in FIG. 7B.

At time t1, SIG6 can be high, turning on transistor M100.

At time t2, SIG5 can be low, turning on transistor M97. Consequently, based on a voltage division from capacitors C91/C92, node N1 can rise.

If elements R91/R92 have states HRS/LRS, respectively, element R92 will shunt C92, pulling node N1 low. As a result, read section 904 will drive OUT high, and latch such a value by operation of transistors M99/M100. Conversely, if elements R91/R92 have states LRS/HRS, respectively, element R91 will shunt C91, pulling node N1 high. As a result, read section 904 will drive OUT low, and latch such a value by operation of transistors M97/M98.

In some embodiments, a voltage VDD can be a power supply voltage that ramps up upon power-up or hard reset.

FIGS. 10A to 10D are schematic diagrams and timing diagrams showing a read section 904 during write operations. The transistor body voltages for M97 and M98 can meet the following: if N3>VDD, Vbody=N3; if N1>VDD, Vbody=N1. FIGS. 10A and 10B show a read section 904 during a first step of a write operation. Such a first step can establish the impedance state of element R91 (e.g., place such an element into the LRS or HRS). Corresponding write voltages applied to the elements are shown: node N3 can receive VPR or VSS; node N1 can receive VSS or VER; and node N2 can be at a high impedance if N1 is VER or VSS if N1 is VSS (by means of OUT and M99).

During such a write operation, as shown at time t3, signal SIG5 can be high, turning off transistor M97, while signal SIG6 can be high, turning on transistor M100. In such an arrangement, when VSS is applied at node N1, the read section 904 can apply VSS at node N2, which can prevent disturb conditions on element R92.

FIGS. 10C and 10D show a read section 904 during a second step of a write operation. Such a second step can establish the impedance state of element R92. Corresponding write voltages applied to the elements are shown: node N3 can be at VER or a high impedance state; node N2 can receive VSS or VPR; and node N1 can receive VER or VSS.

During such a write operation, as shown at time t4, signal SIG5 can be low, turning on transistor M97, while signal SIG6 can be low, turning off transistor M100. In such an arrangement, when VER is applied at node N1, the read section 904 can apply VER at node N3, which can prevent disturb conditions on element R91.

FIGS. 11A and 11B are a schematic diagram and timing diagram showing a read section 1104 that can be included in embodiments, including those shown in FIGS. 5A to 6H. A read section 1104 can include a configuration having many structures like that of FIG. 4A. However, unlike FIG. 4A, a capacitor C111 can receive a signal (POR). Signal pulse POR can apply a known rise time across capacitors C111/C112 and elements R111/R112 for a more reliable voltage division and latching action. In very particular embodiments, a POR signal can be a power-on reset signal. FIG. 11B timing can occur during t5 of FIG. 7B.

As shown by FIG. 11B, prior to time t1, signal SIG5 can go high, as power is applied to a device containing read section 1104.

At time t2, during the POR pulse, signal SIG5 can go low and SIG6 can go high, turning on transistors M117/M110. This can enable the latching operation of read section 1104 based on resistance states of R111 and R112.

Figure 12A:
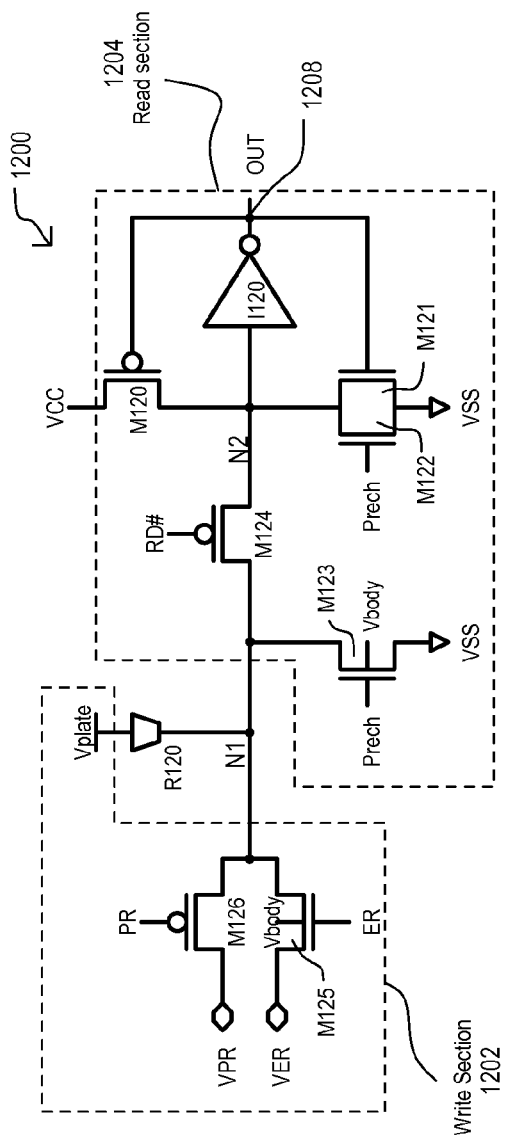
FIGS. 12A and 12B are diagrams showing a circuit having one programmable impedance element, and corresponding modes of operation according to another embodiment.
Figure 12B:
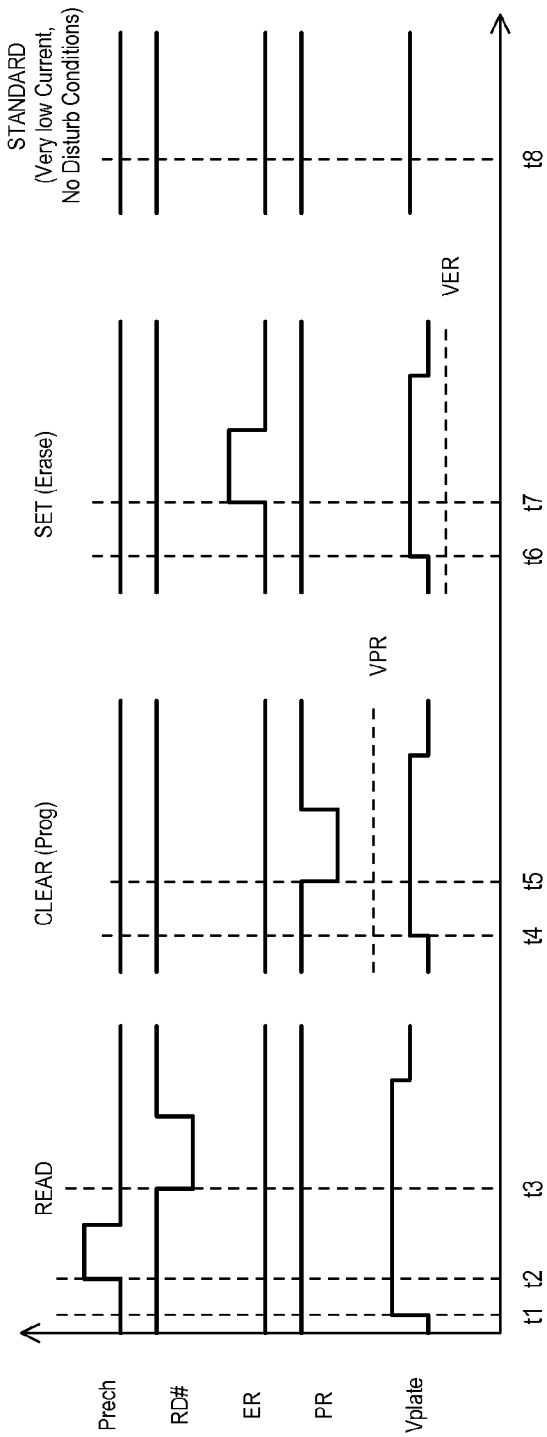

FIGS. 12A and 12B are a schematic diagram and timing diagram showing a circuit 1200 according to a further embodiment. In a particular embodiment, a circuit 1200 can be one implementation of that shown in FIG. 1.

A circuit 1200 can include a write section 1202, a read section 1204, and element R120. A write section 1202 can include a p-channel transistor M126 and n-channel transistor M125. Transistor M126 can have a source-drain path between a program voltage source VPR and a node N1, and a gate that receives a signal PR. Transistor M125 can have a source-drain path between an erase voltage source VER and node N1, and a gate that receives a signal ER.

A read section can include p-channel transistors M120 and M124, n-channel transistors M121, M122 and M123, and inverter I120. Transistor M120 can have a source-drain path between a high supply voltage source VCC and a node N2, and a gate connected to the output (1208) of inverter I120. Transistor M124 can have a source-drain path between nodes N1 and N2, and a gate connected to receive a signal RD#. Transistor M121 can have a source-drain path between node N2 and a low supply voltage source VSS, and a gate connected to the output of inverter I120. Transistor M122 can have a source-drain path between node N2 and VSS, and a gate connected to receive a signal Prech. Transistor M123 can have a source-drain path between node N1 and VSS, and a gate connected to receive signal Prech. Inverter I120 can have an input connected to node N2 and an output that drives output 1208.

Element R120 can be connected between a plate node Vplate and node N1. Referring to FIG. 12B, various modes of operation will be described.

A read mode can include times t1 to t3. In a read mode, the output of inverter I120 (1208) can be driven high or low based on a resistance state of element R120.

At time t1, Vplate can go high, to enable a voltage to be established at node N1 based on the resistance state of element R120.

At time t2, Prech can pulse high. Such an action, can precharge node N1 to VSS. Consequently, if element R120 has the HRS, node N1 can be at a relatively low potential. However, if element R120 has the LRS, node N1 can be at a relatively high potential, due to Vplate. In addition, such an action can precharge node N2 low. Read section 1204 will latch N2 in the low state by operation of inverter I120 and transistor M121.

At time t3, signal RD# can go low, connecting node N1 to N2. Thus, the potential corresponding to the resistance state of element R120 can be transferred to node N2. Thus, if element R120 has the HRS, node N2 can remain latched at the low voltage. However, if element R120 has the LRS, node N2 can rise in potential, over-powering transistor M121 (which can be a weak device). Read section 1204 will thus latch N2 in the high state by operation of inverter I120 and transistor M120.

A clear mode can include times t4 and t5. In a clear mode, element R120 can be placed into one resistance state (in this case programmed to the LRS).

At time t4, Vplate can be driven to a programming level, which can be some relatively low level.

At time t5, PR can go low, applying VPR to node N1. Consequently, a programming voltage can be applied across element R120 that places it into the LRS (i.e., VPR—Vplate is sufficient to program R120).

A set mode can include times t6 and t7. In a set mode, element R120 can be placed into another resistance state (in this case erased to the HRS).

At time t6, Vplate can be driven to an erase level, which can be some relatively low level.

At time t7, ER can go high, applying VER to node N1. VER can be a low voltage, even a negative voltage (with respect to VSS). Accordingly, the body voltages of transistors M125 and M123 are sufficiently low to ensure proper operation of such transistors at the low VER level. Consequently, an erase voltage can be applied across element R120 that places it into the HRS (i.e., Vplate–VER is sufficient to erase R120).

Time t8 shows a standard mode. In a standard mode, one terminal of R120 can be connected to Vplate, while the other terminal (i.e., node N1) can be isolated by transistors M123, M124, M125 and M126 being turned off by signals Prech, RD#, ER and PR, respectively. Thus, element R120 is prevented from being exposed to disturb conditions.

A circuit 1200 can return to the standard mode after each of the other modes.

Figure 13A:
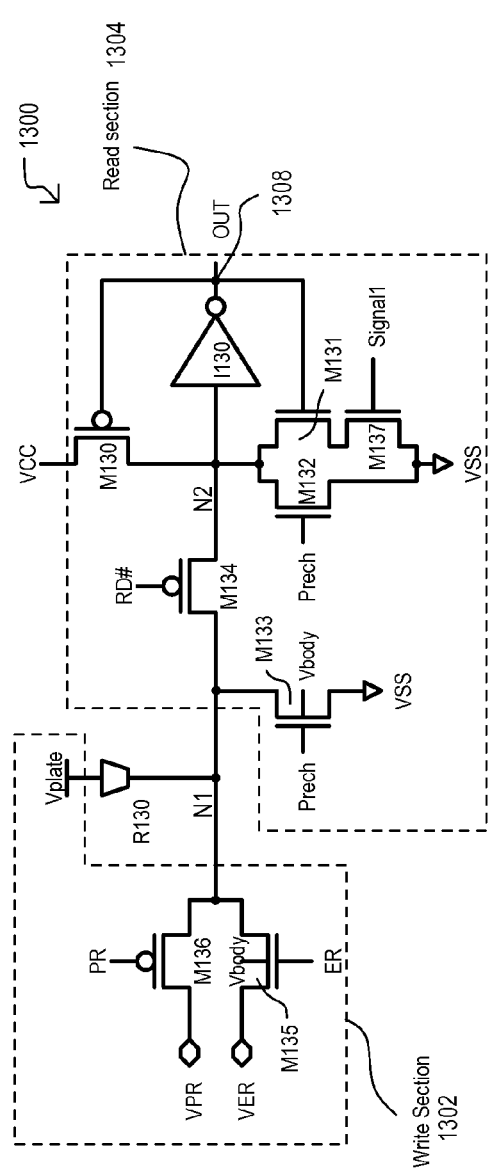
FIGS. 13A and 13B are diagrams showing a circuit having one programmable impedance element, and corresponding modes of operation according to a further embodiment.
Figure 13B:
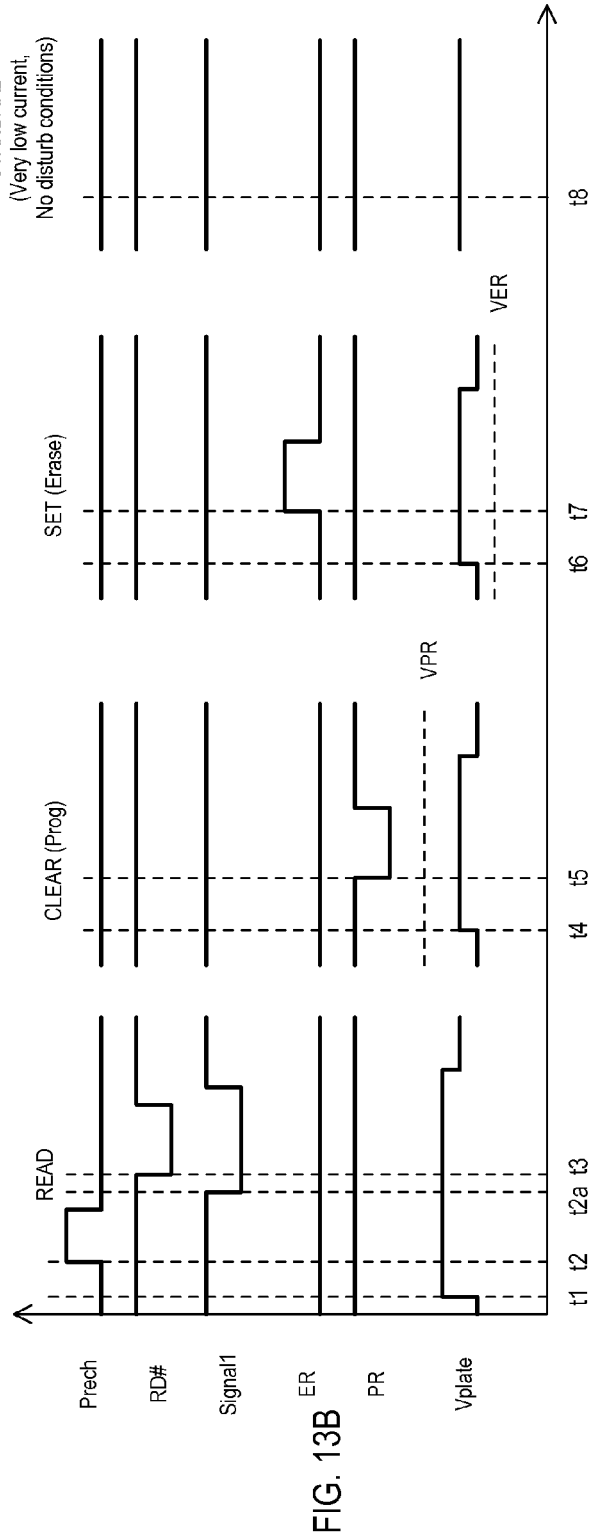

FIGS. 13A and 13B show a circuit according to another embodiment. The circuit of FIGS. 13A and 13B can operate like that of FIGS. 12A and 12B.

The circuit of FIG. 13A differs from that of FIG. 12A in that it further includes transistor M137 having a source-drain path connected between the source of transistor M131 and VSS. Transistor M137 can be controlled by a signal Signal1.

As shown in FIG. 13B, Signal 1 can turn off transistor M137 prior to the RD# pulse, then turn it back on after the RD# pulse. By such an operation, transistor M131 can be isolated in the read operation (i.e., if R120 is low impedance, the potential at node N2 does not have to "overpower" transistor M131).

The various circuits shown herein that can set element states and readout such states can be included in integrated circuit devices to store data and/or circuit configurations in a nonvolatile fashion. In very particular embodiments, such circuits can be included in programmable logic devices, which can include but are not limited to, field programmable gate array (FPGA) type devices. Very particular embodiments are shown below.

Figure 14A:
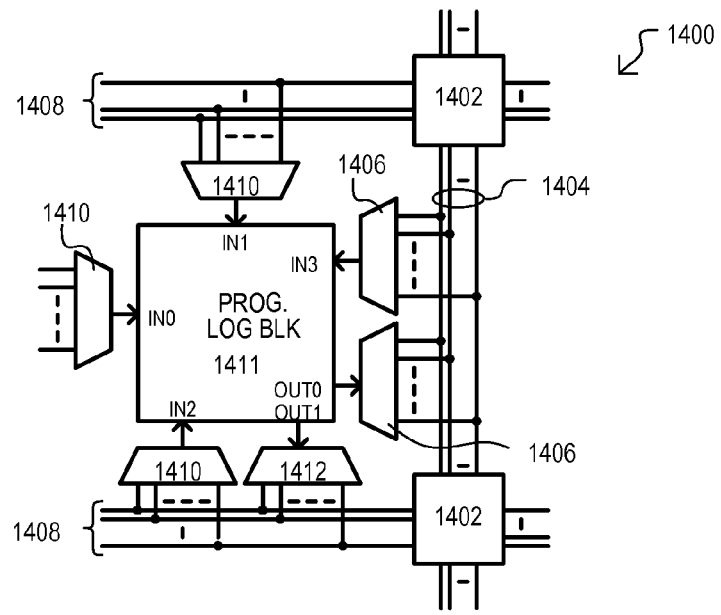
FIGS. 14A to 14C are schematic diagrams showing an integrated circuit device according to embodiments.

FIG. 14A shows an integrated circuit device 1400 according to an embodiment. Device 1400 can include a programmable architecture having a programmable logic block 1411, programmable multiplexers MUXs 1410, programmable demultiplexers (deMUXs) 1412, first direction wiring channels 1408, second direction wiring channels 1404, and switch boxes 1402.

Programmable logic block 1411 may receive input values at any or all of inputs IN0 to IN3, and execute a predetermined logic operation on such inputs to provide output values at any of outputs OUT0 to OUT1. The predetermined logic function may be programmable based on values stored and latched, as described in the embodiments herein, or equivalents.

Programmable MUXs 1410 may selectively connect signal(s) from a corresponding wiring channel, and provide such signal(s) as input value(s) to programmable logic block

1411. Selective connections provided by MUXs (1410) may be provided by circuits described herein, or equivalents.

Programmable deMUXs 1406 may selectively connect signal(s) from a programmable logic block 1411 to a corresponding wiring channel. Selective connections provided by deMUXs 1406 may be provided by circuits described herein, or equivalents.

Switch boxes 1402 may selectively connect lines of wiring channels of different directions. Such selective connections can be established by circuits described herein, or equivalents.

Figure 14B:
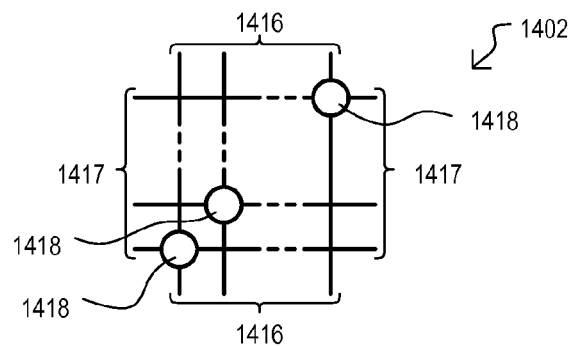

FIG. 14B shows a switch box 1402 according to one embodiment. Switch box 1402 may be formed at an intersection of first wiring channels 1416 and second wiring channels 1417. Within switch box 1402, a switching element 1418 may be formed at an intersection of four conductive lines from different wiring channels. A switching element 1418 may selectively connect one conductive line to one or more other conductive lines with switch links. Such switch links can be controlled by circuits as described herein (i.e., an OUT signal can determine if a switch link is conducting or non-conducting).

Figure 14C:
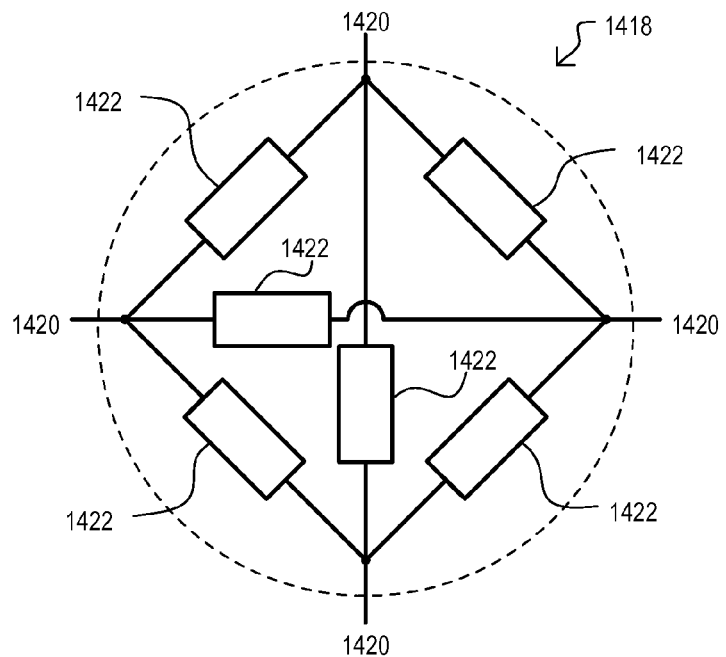

FIG. 14C shows a switching element 1418 according to one embodiment. A switching element 1418 may be one example of a structure that may be included in a switching element (1418) of FIG. 14B. Switching element 1418 may include switch links 1422 that provide programmable conductive connections between conductive lines 1420. Switch links 1422 may be controlled by circuits as described herein, or equivalents. That is, a conductivity of a switch link 1422 can be established by the OUT signal from a circuit. A switch link can be a transistor, or multiple transistors in passgate or analog switch type configuration.

In the various embodiments shown it is understood that control signals can be "boosted" signals to reduce or eliminate threshold voltage (Vt) drops through transistors.

It is also understood that while embodiments can include programmable elements formed with solid electrolytes, metal oxides, chalcogens and combinations thereof, other embodiments can include any other suitable programmable element type.

It should be appreciated that reference throughout this description to "one embodiment" or "an embodiment" means that a particular feature, structure or characteristic described in connection with the embodiment is included in at least one embodiment of an invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

It is also understood that other embodiments of this invention may be practiced in the absence of an element/step not specifically disclosed herein.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A circuit, comprising:
   at least one two terminal element programmable between at least two impedance states;
   a write section configured to place the element into different impedance states in a write mode; and
   a read section configured to generate an output value corresponding to the impedance state of at least one element in a read mode; wherein
   the at least one element draws substantially no current in a standard mode that is different from the write and read modes,
   the read section includes at least one latch circuit configured to statically store the output value in response to the read mode, the latch circuit including
   an inverter having an inverter input coupled to at least one element,
   a first feedback transistor having a controllable impedance path coupled between the inverter input and a first power supply node, and a control terminal coupled to an inverter output, and
   an isolation transistor having a controllable impedance path in series with that of the first feedback transistor between the inverter input and a power supply node; wherein
   the isolation transistor is in a high impedance state in the standard mode.

2. The circuit of claim 1, wherein:
   the write section includes
   a precharge device that precharges a second terminal of the element to a second voltage to write a first data value in the write mode, and
   a capacitor coupled to the second terminal of the element and configured to boost the potential beyond the second voltage in response to a boost pulse to write the first data value in the write mode.

3. The circuit of claim 2, wherein:
   the write section further includes
   a write device that couples the second terminal of the element to a third voltage to write a second data value in the write mode, and
   the select device couples the first terminal of the element to a fourth voltage to write the second data value in the write mode.

4. The circuit of claim 1, wherein:
   in the standard mode, the read section is configured to couple a first terminal of the element to a first power supply voltage and isolate a second terminal of the element when the element has a first impedance state.

5. The circuit of claim 1, wherein:
   the at least one element includes at least one programmable layer;
   the write section is configured to apply electric fields to alter a conductivity of the programmable layer; wherein
   the programmable layer comprises a layer selected from: a chalcogenide and a metal oxide.

6. The circuit of claim 1, further including:
   programmable logic circuits configurable in response to at least the output value of the read section.

7. A circuit, comprising:
   at least two elements programmable between at least two impedance states, the elements being two terminal elements;

a write section configured to place the elements into different impedance states in a write mode; and a read section configured to generate an output value corresponding to the impedance state of at least two elements in a read mode; wherein the at least two elements draw substantially no current in a standard mode that is different from the write and read modes, the write section is configured to apply a first voltage to a first terminal of a first element, a second voltage to second terminals of the first and second elements, to place the first element in a first impedance state in the write mode, and the read section applies the second voltage to the first terminal of the second element when the first element is placed in the first impedance state in the write mode.

8. The circuit of claim 7, wherein:

the elements include a first element connected to a second element at an input node, the first and second elements being coupled in series between a first power supply node and a second power supply node; and the read section includes a sense circuit having an input coupled to the input node and configured to generate an output value in response to a potential at the input node.

9. The circuit of claim 8, wherein:

the read section further includes a first capacitor having one terminal coupled to the input node, and a second capacitor having one terminal coupled to the input node and a second terminal coupled to the second power supply node.

10. The circuit of claim 9, wherein:

a second terminal of the first capacitor is coupled to one selected from the group of: the first power supply node and a rising voltage generated in response to predetermined conditions of a device containing the circuit.

11. The circuit of claim 7, wherein:

the at least two elements includes at least one programmable layer;

the write section is configured to apply electric fields to alter a conductivity of the programmable layer; wherein the programmable layer comprises a layer selected from: a chalcogenide and a metal oxide.

12. A method, comprising:

latching a data value established by at least one programmable impedance element as power is applied to an integrated circuit (IC) device that includes the elements;

after the data value is latched, preventing a current from flowing through the at least one element;

programming two elements to establish a first data value, including
setting a first element to a first impedance state, and
setting a second element to a second impedance state; and programming the two elements to establish a second data value, including
setting the first element to the second impedance state, and
setting the second element to the first impedance state; wherein the at least one element is a two terminal element.

13. The method of claim 12, further including:

latching a data value includes temporarily coupling the at least one element to an input node of a latch circuit.

14. The method of claim 12, further including:

setting the at least one element to one impedance state by precharging one terminal of the element to a predetermined voltage, and boosting the potential at the one terminal of the element with a charge pumped capacitance.

15. The method of claim 12, wherein:

the first and second elements disposed in series; and latching the data value includes developing a voltage across two capacitors in series as power is applied to an device that includes the elements, and developing the voltage across the two elements in series as power is applied; wherein the capacitors and elements are commonly connected at an input node, and one element is programmed to a lower impedance than the other element to shunt one of the capacitors to drive the input node toward a predetermined potential.

16. The method of claim 12, wherein:

latching the data value includes applying a pulse to two capacitors in series, and developing the voltage across two elements in series; wherein the capacitors and elements are commonly connected at an input node, and one element is programmed to a lower impedance than the other element to shunt one of the capacitors to drive the input node toward a predetermined potential.

17. The method of claim 12, wherein:

the at least one element includes at least one programmable layer selected from the group of: a chalcogenide and a metal oxide.

* * * * *